United States Patent [19]
Dahlberg et al.

[11] Patent Number: 6,166,539
[45] Date of Patent: *Dec. 26, 2000

[54] MAGNETORESISTANCE SENSOR HAVING MINIMAL HYSTERESIS PROBLEMS

[75] Inventors: E. Dan Dahlberg, Roseville; Timothy J. Moran, Minneapolis, both of Minn.

[73] Assignee: Regents of the University of Minnesota, Minneapolis, Minn.

[*] Notice: This patent issued on a continued prosecution application filed under 37 CFR 1.53(d), and is subject to the twenty year patent term provisions of 35 U.S.C. 154(a)(2).

[21] Appl. No.: 08/739,632

[22] Filed: Oct. 30, 1996

[51] Int. Cl.$^7$ .......................... G01R 33/02; G11B 5/127
[52] U.S. Cl. ........................................ 324/252; 360/113
[58] Field of Search .................. 324/252, 207.21; 360/113, 125; 338/32 R

[56] References Cited

U.S. PATENT DOCUMENTS

| | | | |
|---|---|---|---|
| Re. 30,166 | 12/1979 | Lee | 365/122 |
| 3,629,566 | 12/1971 | Brickner | 235/183 |

(List continued on next page.)

FOREIGN PATENT DOCUMENTS

| | | |
|---|---|---|
| 0074219 | 3/1983 | European Pat. Off. . |
| 1063037 | 3/1967 | Germany . |
| 2064140 | 6/1981 | United Kingdom . |

OTHER PUBLICATIONS

Flynn, D., "Demodulation of a magnetoresistive sensor signal to achieve a low–cost, stable and high–resolution vector magnetometer", *Elsevier Science S.A.*, 50, pp. 187–190, (1995).

Moran, T.J., et al., "Magnetoresistive sensor for weak magnetic fields", *American Institute of Physics,*, Appl. Phys. Lett. 7o(14), pp. 1894–1896, (Apr. 7, 1997).

(List continued on next page.)

*Primary Examiner*—Jay Patidar
*Attorney, Agent, or Firm*—Schwegman, Lundberg, Woessner & Kluth, P.A.

[57] ABSTRACT

The present invention provides a method and apparatus for utilizing magnetoresistance devices for the measurement of weak magnetic fields. An oscillating excitation magnetic field is applied to a magnetoresistive (MR) sensing element such that the MR element is driven into one or both of two antiparallel saturation states. The amplitude of the excitation field is large enough to reverse the magnetization of the soft layer during each cycle. In one embodiment, the MR element is provided with a current, and a voltage proportional to the resistance is measured. Components of the voltage signal at multiples of the excitation frequency are then proportional to the environmental magnetic field. In one embodiment, an MR element having a resistance-versus-field transfer function that is symmetric (e.g., an anisotropic MR element) is used; while in another embodiment, an MR element having a resistance-versus-field transfer function that is asymmetric (e.g., a spin-valve MR element) is used. Various apparatus and methods for measuring the amount of time spent in one or both saturated states versus the unsaturated or transition states are described. In one embodiment, the magnetic excitation field is generated using a current strip deposited onto the top of the other device layers, so that the entire device can be produced on a single chip. In one embodiment, a "flexible" magnetoresistive structure includes a "flexible" ferromagnetic layer having a hard-magnetization-portion layer, and a soft-magnetization-portion layer, thus providing a smooth magnetic transition when this bilayer switches. One embodiment includes a supporting data-read head structure that positions the flexible magnetoresistive (MR) sensing element to sense a magnetic field in a data storage device such as a magnetic-disk drive.

20 Claims, 23 Drawing Sheets

U.S. PATENT DOCUMENTS

| | | | |
|---|---|---|---|
| 3,631,415 | 12/1971 | Aagard et al. | 340/174 YC |
| 3,698,010 | 10/1972 | Lee | 340/174 YC |
| 3,720,453 | 3/1973 | Lee et al. | 350/3.5 |
| 3,731,290 | 5/1973 | Aagard | 340/174 YC |
| 3,734,625 | 5/1973 | Aagard | 356/118 |
| 3,942,258 | 3/1976 | Stucki et al. | 33/361 |
| 4,259,703 | 3/1981 | Young et al. | 360/113 |
| 4,280,158 | 7/1981 | di Niet | 360/113 |
| 4,343,026 | 8/1982 | Griffith et al. | 360/113 |
| 4,503,394 | 3/1985 | Kawakami et al. | 324/252 |
| 4,533,872 | 8/1985 | Boord et al. | 324/252 |
| 4,640,016 | 2/1987 | Tanner et al. | 33/356 |
| 4,847,584 | 7/1989 | Pant | 338/32 R |
| 4,918,824 | 4/1990 | Farrar | 33/361 |
| 4,996,621 | 2/1991 | Ruigrok et al. | 360/126 |
| 5,046,260 | 9/1991 | Wellhausen | 33/356 |
| 5,159,513 | 10/1992 | Dieny et al. | 360/113 |
| 5,161,311 | 11/1992 | Esmer et al. | 33/356 |
| 5,175,936 | 1/1993 | Sato | 33/354 |
| 5,199,178 | 4/1993 | Tong et al. | 33/361 |
| 5,206,590 | 4/1993 | Dieny et al. | 324/252 |
| 5,216,560 | 6/1993 | Brug et al. | 360/113 |
| 5,243,316 | 9/1993 | Sakakima et al. | 338/32 R |
| 5,247,278 | 9/1993 | Pant et al. | 338/32 R |
| 5,255,442 | 10/1993 | Schierbeek et al. | 33/361 |
| 5,277,991 | 1/1994 | Satomi et al. | 428/611 |
| 5,301,079 | 4/1994 | Cain et al. | 360/113 |
| 5,341,118 | 8/1994 | Parkin et al. | 338/32 R |
| 5,341,261 | 8/1994 | Dieny et al. | 360/113 |
| 5,366,815 | 11/1994 | Araki et al. | 428/611 |
| 5,422,571 | 6/1995 | Gurney et al. | 324/252 |
| 5,432,734 | 7/1995 | Kawano et al. | 365/158 |
| 5,434,733 | 7/1995 | Hesterman et al. | 360/113 |
| 5,435,070 | 7/1995 | Kilian | 33/361 |
| 5,440,233 | 8/1995 | Hodgson et al. | 324/252 |
| 5,442,508 | 8/1995 | Smith | 360/113 |
| 5,447,781 | 9/1995 | Kano et al. | 428/212 |
| 5,452,163 | 9/1995 | Coffey et al. | 360/113 |
| 5,457,752 | 10/1995 | Engdahl et al. | 381/190 |
| 5,462,809 | 10/1995 | Berkowitz | 428/546 |
| 5,465,185 | 11/1995 | Heim et al. | 360/113 |
| 5,469,054 | 11/1995 | Bicking | 324/207.2 |
| 5,475,304 | 12/1995 | Prinz | 324/207.21 |
| 5,476,680 | 12/1995 | Coffey et al. | 427/130 |
| 5,485,334 | 1/1996 | Nix et al. | 360/113 |
| 5,487,356 | 1/1996 | Li et al. | 117/99 |
| 5,491,606 | 2/1996 | Hesterman et al. | 360/113 |
| 5,493,465 | 2/1996 | Kamiguchi et al. | 360/113 |
| 5,498,298 | 3/1996 | Wecker et al. | 148/105 |
| 5,520,059 | 5/1996 | Garshellis | 73/862.335 |
| 5,521,500 | 5/1996 | Schuhl et al. | 324/249 |
| 5,532,892 | 7/1996 | Nix et al. | 360/113 |
| 5,654,854 | 8/1997 | Mallary | 360/113 |
| 5,844,755 | 12/1998 | Yamane et al. | 360/113 |

OTHER PUBLICATIONS

"Honeywell 2300 Series Small Digital Magnetometer Price List Rev. Dec. 1995", from the Solid State Electronics Center, 11 pages, (1995).

"MG–7D Portable Hand–Held Magnetometer/Gaussmeter", Walker Scientific Inc. of Walker Magnetics Group, 2 pages.

"Macintyre Electronic Design Associates, Inc. (MEDA, Inc.)", Domestic Price Schedule Effective Jan. 1, 1996 (4 pages).

"Fluxgate Magnetometer Fluxmaster", Two–page product guide from Germany.

"Applied Physics Systems of Mountain View, CA", Model APS520 3 Axis Fluxgate Magnetometer System, 2 catalog pages.

Rene M. de Ridder, et al., "Orthogonal Thin Film Magnetometer Using the Aniostropic Magnetoresistance Effect", *IEEE Transactions on Magnetics,* Abstracts, 20, 960–962, (Sep. 1984).

Gordon E. Fish, "Soft Magnetic Materials", Proceedings of the IEEE, vol. 78, No. 6, 947–972, (1990).

R. B. Fryer, "Thin Film Magnetic Sensors", *Honeyweller,* 32–34.

James Holmen, "The Development of Magnetic Thin–Film Sensors", 29–36.

W. Kwiatkowski, et al., "The Permalloy Magnetoresistive Sensors—Properties and Applications", *Warsaw Technical University*.

James E. Lenz, "A Review of Magnetic Sensors", Proceedings of the IEEE, vol. 78, No. 6, 973–989, (1990).

Bharat B. Pant, "Magnetoresistive Sensors", *Scientific Honeyweller,* Fall 1987, 29–34, (1987).

Eugene Paperno, et al., "Suppression of Barkhausen Noise in Magnetoresistive Sensors Employing AC Bias", *IEEE Transactions on Magnetics,* 31, 3161–3163, (Nov. 1995).

Eugene Paperno, et al., "Simltaneous Measurement of Two DC Magnetic Field Components by a Single Magnetoresistor", *IEE Transactions on Magnetics,* 31, 2269–2273, (May 1995).

S. S.P. Parkin, "Origin of Enhanced magnetoresistance of Magnetic Multilayers: Spin–Dependent Scattering from Magnetic Interface States", *Physical Review Letters,* 71, 1641–1644, (1993).

F. Primdahl, "The Fluxgate Magnetometer", *Phys. E. Sci. Instrum.,* 12, (1979).

Jaquelin K. Spong, et al., "Giant Magnetoresistive Spin Valve Bridge Sensor", *IEEE Transactions on Magnetics,* 32, 366–371, (Mar. 1996).

George Wu, "Properties of Thin Magnetoresistive Films", *Honeyweller,* 34–36.

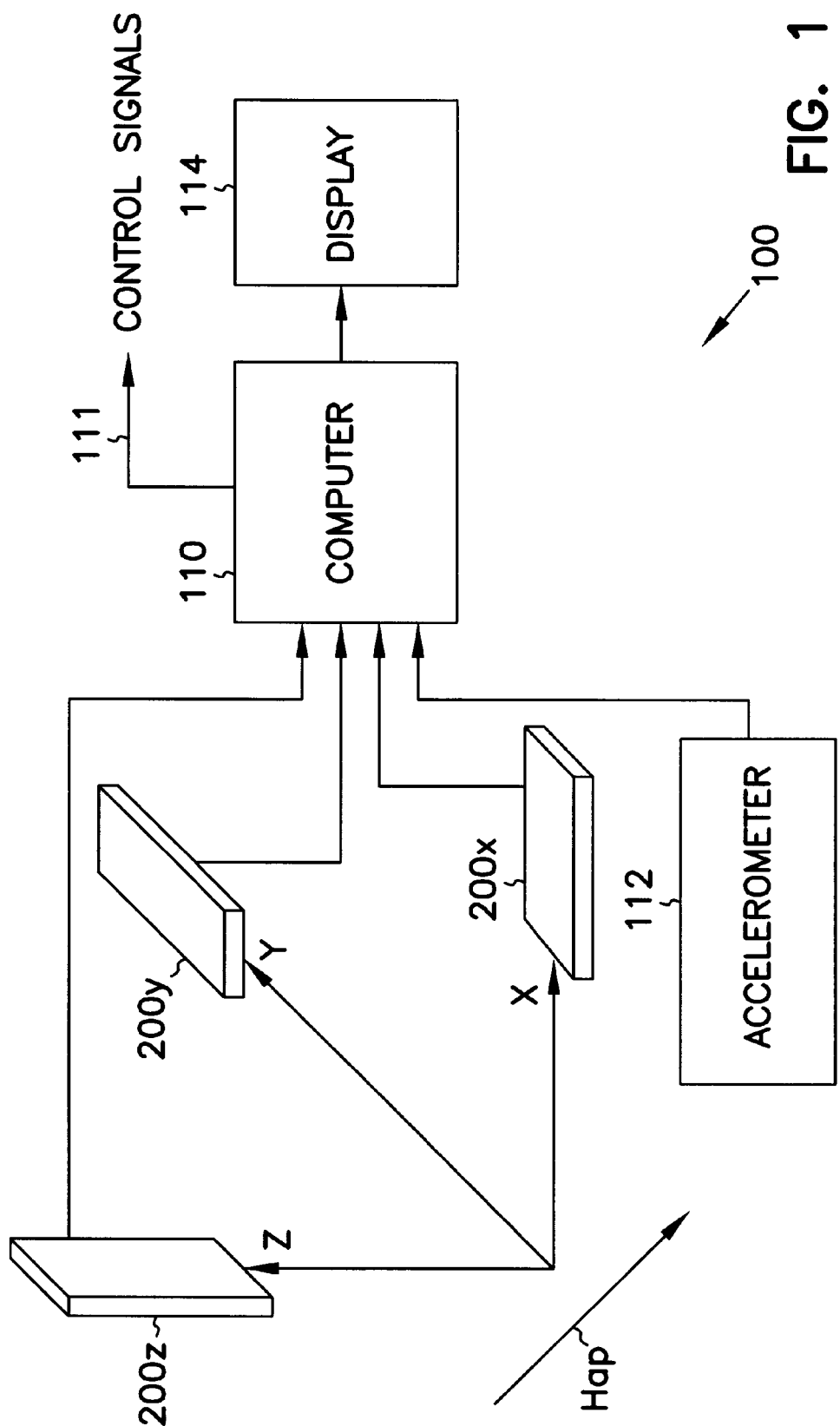

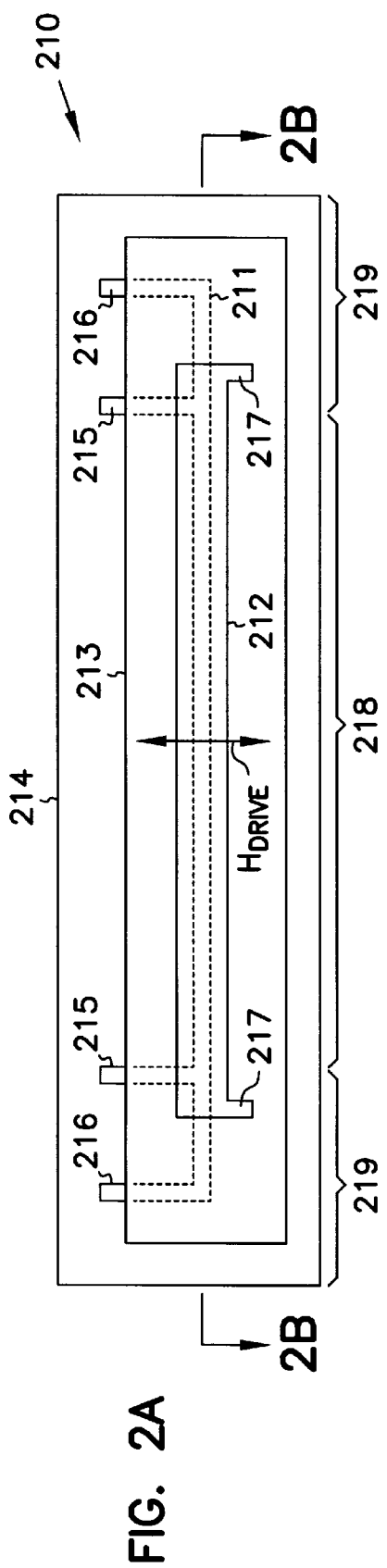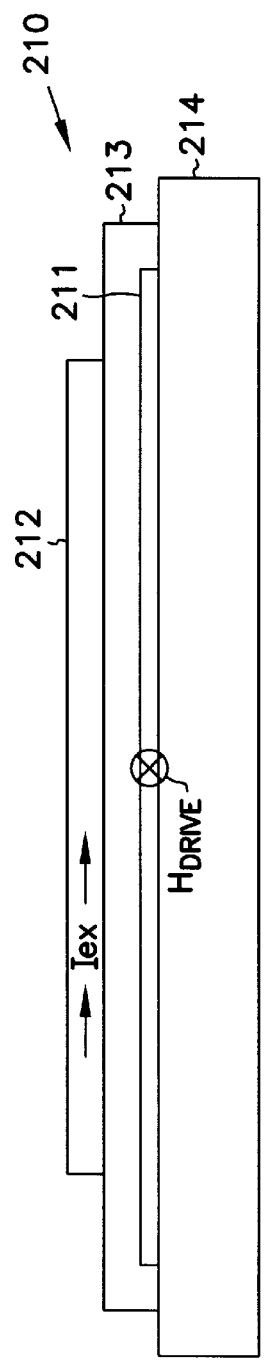
FIG. 2A
FIG. 2B
FIG. 2C

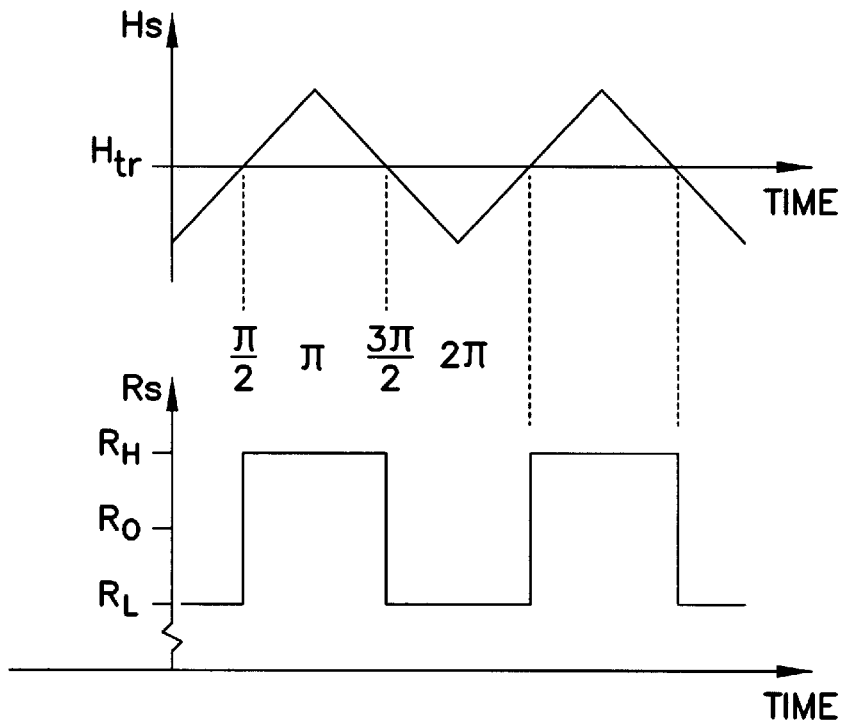
FIG. 7A
FIG. 7B
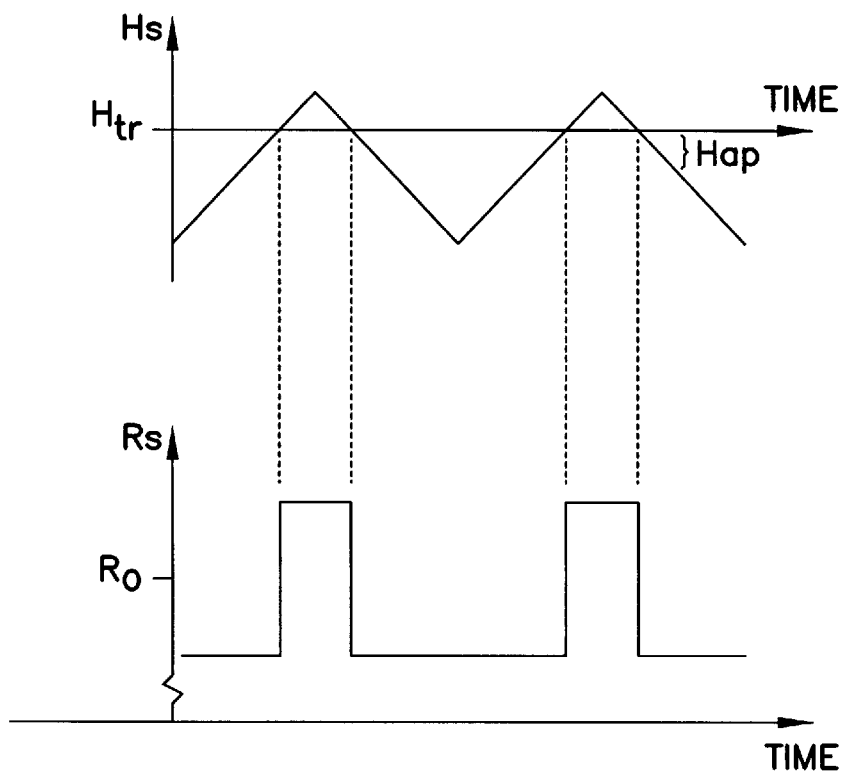
FIG. 7C
FIG. 7D

MAGNETORESISTANCE SENSOR HAVING MINIMAL HYSTERESIS PROBLEMS

FIELD OF THE INVENTION

This invention relates to the field of magnetic sensors and methods, and more specifically to a method and apparatus of sensing weak magnetic fields using magnetoresistance sensors and flux-gate techniques, useful as a compass, magnetic-recording read head, or other magnetic-field sensor.

BACKGROUND OF THE INVENTION

As discussed in U.S. Pat. NO. 4,918,824 (issued Apr. 24, 1990 to Farrar), one fundamental vehicle navigation requirement is the direction in which the vehicle is traveling, and for about the last 2000 years the most fundamental navigation instrument has been the magnetic compass. The electronic compass is a single example of a general class of instruments called magnetometers (magnetic-field sensors), and more specifically it is classified as a vector magnetometer. This is because the earth's magnetic field is a 3-dimensional vector and the purpose of a compass, for example, in a vehicle, is to determine the vehicle's direction (magnetic heading) relative to the two horizontal components of this 3-dimensional vector field.

While there have been many forms of magnetometers developed, many electronic compass systems use what is called a flux-gate magnetometer. The flux-gate vector magnetometer is based upon a core made of high permeability magnetic material, wherein an external applied (or "environmental") field such as the earth's field, normally external to the core and along its axis, is alternately pulled into and released from the core material. This is what is referred to as gating the external field. This is done by driving the core of high permeability magnetic material into two antiparallel saturation states at a relatively high frequency with a primary coil. The transition of the core is sensed inductively by a secondary coil. The signal from the secondary coil is then coupled to a lockin-type amplifier which produces a DC signal proportional to the applied or environmental field.

Analyses of the flux-gate mechanism have been reported by a number of authors, for example: D. I. Gordon, et al., IEEE Transactions On Magnetics, MAG 1, No. 4, December 1965, "Factors Affecting the Sensitivity of Gamma-Level Ring Core Magnetometers"; S. V. Marshall, IEEE Transactions On Magnetics, MAG 3, September, 1967, "An Analytic Model For the Flux-Gate Magnetometer"; F. Primdahl, IEEE Transactions On Magnetics, MAG 6, No. 2, June 1970, "The Gating Curves of Parallel and Orthogonal Flux-Gates"; J. R. Burger, IEEE Transactions On Magnetics, MAG 8, No. 4, December 1972, "The Theoretical Output of a Ring Core Flux-Gate Magnetometer"; and D. I. Gordon et al., IEEE Transactions on Magnetics, MAG 8, No. 1, March 1972, "Recent Advances in Flux-Gate Magnetometry".

As discussed in U.S. Pat. No. 5,199,178 (issued Apr. 6, 1993 to Tong, et al.), a magnetic flux-gate sensor of the ring-shaped core type is relatively good in detection sensibility. Its structure is simple and its subsequent signal-treating circuit is relatively simple. However, it has the following disadvantages due to the present manufacturing processes: First, it is difficult to fabricate a magnetic core with uniform cross section to ensure a constant magnetic flux.

Further, automatic winding of a uniform excitation coil on a ring-shaped core is difficult, and non-uniform coil winding will cause a magnetic azimuth error to occur.

Further, it is difficult to obtain a uniform winding distribution in the sensing coils. When this happens, the directions of the input axis of the sensing coils are displaced from the desired direction with the result that a magnetic azimuth error occurs.

Further, the sensor is too large in size for certain practical uses (for example, a prior sensor has a diameter of 10–50 mm, and a thickness of 3 mm).

Further, a permalloy core, if not protected and supported, is easily broken by vibration and/or shock. A number of solutions have been proposed to alleviate the above problems.

For many magnetic materials, the electrical resistance depends on the angle between the current vector and the magnetization vector. Since the magnetization vector can be rotated by an applied magnetic field, the resistance depends on the applied magnetic field. This property is known as anisotropic magnetoresistance ("AMR"). In all cases, the AMR change in resistance is identical for antiparallel magnetization states.

Recently, a class of layered magnetic materials were discovered which had larger changes in resistance when magnetic fields were applied compared to AMR materials. The term "giant magnetoresistance" ("GMR") is used to describe these materials because the changes in resistance (3–200%), are much larger than those for traditional AMR materials (0–2%). The term "spin-valve magnetoresistance" ("SVMR") is also used for the GMR phenomenon because the resistance is observed to depend on the magnetization directions of neighboring magnetic materials. Rotating the magnetization vector of one layer relative to a neighboring layer changes the total resistance, which is analogous to a valve in a water pipe.

A typical device that acts as a magnetic sensor using spin-valve magnetoresistance is illustrated prior art in FIG. 5A. The upper ferromagnet layer 302 is pinned by the antiferromagnet layer 301; the magnetization vector stays pointing in one direction to first approximation. The lower ferromagnet layer 303 is designed to rotate freely in response to applied fields (a soft-magnetization layer), and is separated from the upper ferromagnet layer 302 by spacer layer 319.Therefore, applied fields change the angle between the respective magnetization vectors of the two layers. Changing this angle has a large effect on the resistance of the total structure, typically on the order of 2–8%. The hysteresis loop shown in prior art FIG. 6B showing resistance versus applied magnetic field represents the switching of the soft layer 303.

This concept is described in U;S. Pat. Nos. 5,206,590 (issued Aug. 23, 1994 to Dieny, et al.) and 5,159,513 (issued Oct. 27, 1992 to Dieny, et al.). In the most commonly described embodiment, the relative angle is designed to sit at the most sensitive point of the response curve while the sensor is moved past magnetic media. An applied field rotates the magnetization of the soft layer and produces a change in resistance.

Both AMR and SVMR materials can thus be used to detect magnetic fields. However, when used as a sensor for fields smaller than the saturation field of the soft ferromagnetic layer $H_{SAT}$, the magnetization state of the soft layer then depends on its magnetic history. Further, as the magnetization direction of an MR structure is changed, various noise mechanisms, collectively called Barkhausen noise, prevent a smooth, reproducible hysteresis curve from being followed.

Therefore, a need exists for a low-cost, easy-to-construct magnetometer for weak magnetic fields.

SUMMARY OF THE INVENTION

This invention provides a method and sensor for sensing weak magnetic fields using magnetoresistance materials and flux-gate-like techniques. In one embodiment, the sensor is used in a geomagnetic compass.

A technique is described for utilizing either spin-valve magnetoresistance (SVMR) or anisotropic magnetoresistance (AMR) materials for the measurement of magnetic fields and in particular weak magnetic fields. One embodiment includes means for applying a magnetic driving field to the sensing element in addition to the environmental field HAP to be measured. The driving field includes a DC offset added to an oscillating sine wave, triangle wave or similar waveform. The amplitude of the oscillating field is set to be large enough to reverse the magnetization direction of the soft magnetic material during each cycle. In one preferred embodiment, the environmental field HAP is applied using an electrical conductor strip deposited onto the top of the other layers and driven by an electric current, so that the entire device can be produced on a single chip.

One embodiment describes a magnetic-field sensor for sensing an external environmental magnetic field. This sensor includes a magnetoresistive (MR) sensing element (which may be constructed in a manner similar to any of a number of conventional structures, or of novel structures according to the present invention), and an excitation strip or structure magnetically coupled to the MR sensing element. A first driving circuit is coupled to the excitation structure, and provides a drive signal to the excitation structure to create an excitation magnetic field that oscillates about a total bias value. A second driving circuit that produces an electrical current (which is DC in one embodiment, and AC in another) through the MR sensing element. A sensing circuit converts a sensed signal (e.g., a voltage proportional to the magnetoresistance of the MR sensing element) from the MR sensing element into an output signal representative of the external environmental magnetic field. The output signal can then be processed to display the magnitude and/or direction of the external field.

Another embodiment couples the output signal to the first driving circuit in order to provide a feedback component that varies the total bias value so as to keep the sensing element in a range chosen to achieve sensitivity and/or linearity.

In yet another embodiment, the drive signal oscillates as substantially a triangle wave about the total bias value, in order to drive the sensor into saturation and thus reduce errors due to the effects of magnetic history.

In one embodiment, the magnetoresistive sensing element includes a magnetoresistance material having a substantially symmetric resistance-versus-field transfer function and the sensing circuit measures a signal representative of one or more odd multiples of the driving frequency so as to produce an output signal representative of the external environmental magnetic field.

In another embodiment, the magnetoresistive sensing element includes a magnetoresistance material having a substantially asymmetric resistance-versus-field transfer function and the sensing circuit measures a signal representative of one or more even multiples of the driving frequency, possibly including a DC component, so as to produce an output signal representative of the external environmental magnetic field.

In one embodiment, the sensing circuit measures a time proportion representative of a ratio of a time that the magnetic-field sensor is in one or more saturated states to a time that the magnetic-field sensor is in one or more unsaturated states, whereby an output signal representative of the external environmental magnetic field is produced.

In another embodiment, the sensing circuit measures a time proportion representative of a ratio of a time that the magnetic-field sensor is in a first saturated state to a time that the magnetic-field sensor is in a second saturated state, whereby an output signal representative of the external environmental magnetic field is produced.

In one embodiment, a magnetic compass system for sensing a geomagnetic field is constructed and includes two magnetic-field sensors as described in one or another of the embodiments described above.

One embodiment of the present invention provides a magnetoresistive (MR) sensing element that includes a magnetoresistive structure comprising a high-resistivity ferromagnetic layer and a first low-resistivity ferromagnetic layer located adjacent to the high-resistivity ferromagnetic layer. In one such embodiment, the high-resistivity ferromagnetic layer is a soft ferromagnetic material, and is between approximately 2 nanometers and 1000 nanometers thick, and the first low-resistivity ferromagnetic layer is thinner than the high-resistivity ferromagnetic layer, and is between approximately 0.2 nanometers and 100 nanometers thick. In one such embodiment, the thick, high-resistivity ferromagnetic layer comprises NiFeMo in a ratio of approximately 80% Ni, 16% Fe, and 4% Mo, and is approximately 1200 angstroms thick; and the first thin, low-resistivity ferromagnetic layer comprises cobalt or a cobalt alloy, and is approximately 20 angstroms thick.

In one embodiment, this magnetoresistive structure further includes a spacer layer located adjacent to the first thin, low-resistivity ferromagnetic layer; and a hard ferromagnetic layer or structure having a hard magnetization in a first direction.

In another embodiment, this magnetoresistive structure further includes a spacer layer located adjacent to the first low-resistivity ferromagnetic layer; and a second ferromagnetic layer located adjacent to the spacer layer; and a pinning layer located adjacent to the second ferromagnetic layer. In one such embodiment, the thick, high-resistivity ferromagnetic layer comprises NiFeMo in a ratio of approximately 80% Ni, 16% Fe, and 4% Mo, and is approximately 1200 angstroms thick; the first thin, low-resistivity ferromagnetic layer comprises cobalt or a cobalt alloy, and is approximately 20 angstroms thick; the spacer layer comprises copper, and is approximately 35 angstroms thick; the second thin, low-resistivity ferromagnetic layer comprises cobalt or a cobalt alloy, and is approximately 30 angstroms thick; and the pinning layer comprises FeMn in a ratio of approximately 50% Fe and 50% Mn, and is approximately 85 angstroms thick.

Another embodiment of the present invention provides a magnetoresistive (MR) sensing element having a magnetoresistive structure comprising a first ferromagnetic layer having a hard magnetization in a first direction, and having an interface surface that is substantially planar; a second "flexible" ferromagnetic layer having an interface surface that is substantially planar and generally facing the interface layer of the first ferromagnetic layer; a spacer layer of non-ferromagnetic material located between the interface surface of the first ferromagnetic layer and the interface surface of the second ferromagnetic layer. The second "flexible" ferromagnetic layer includes a hard-magnetization-portion layer having a hard magnetization in a second direction, and a soft-magnetization-portion layer located between the spacer layer and the hard portion layer, thus providing a smooth magnetic transition when this layer switches.

In one such embodiment, this magnetoresistive structure includes a structure wherein the first ferromagnetic layer comprises a first pinning layer; a first thin ferromagnetic layer that is located between the first pinning layer and the space layer, and that is pinned to hard magnetization in the first direction by the first pinning layer. The second ferromagnetic layer comprises a second pinning layer; a second thick ferromagnetic layer located between the second pinning layer and the space layer, and in which the hard portion layer is located adjacent to the second pinning layer and is pinned to hard magnetization in the second direction by the pinning layer, and the soft portion layer is located between the hard portion layer and the spacer layer and such that the soft portion layer is substantially not pinned by the hard portion layer (i.e., the soft portion layer is only weakly pinned, and thus has a magnetization whose direction is easily rotated by an external applied field).

In one such embodiment, this flexible magnetoresistive structure further includes a supporting data-read head structure that positions the magnetoresistive (MR) sensing element to sense a magnetic field in a data storage device such as a magnetic-disk drive.

In another embodiment, a magnetoresistive element is described that includes a first soft ferromagnetic layer; a hard ferromagnetic layer; a first conductive non-ferromagnetic spacer layer located between the first soft ferromagnetic layer and the hard ferromagnetic layer and adjoining each; a second soft ferromagnetic layer; and a second conductive non-ferromagnetic spacer layer located between the second soft ferromagnetic layer and the hard ferromagnetic layer and adjoining each. In one such embodiment, the first and second soft layers are each approximately one hundred angstroms permalloy (100 Å NiFe), the first and second conductive non-ferromagnetic spacer layers are each approximately thirty-five angstroms copper (35 Å Cu), and the hard ferromagnetic layer is approximately ten angstroms cobalt (10 Å Co).

BRIEF DESCRIPTION OF THE DRAWINGS

FIG. 1 is an isometric block diagram of an exemplary compass system 100 using three saturation-excited magnetoresistance ("SEMR") sensors 200.

FIG. 2A is a top view showing one embodiment of an SEMR sensor element 210.

FIG. 2B is a side view of the SEMR sensor element 210 of FIG. 2A.

FIG. 2C is a top view showing a MR strip 211 and showing the active and parasitic resistances and regions.

FIG. 7A shows a graph of the sensed magnetic field $H_S$ varying with time due to the excitation field $H_{DRIVE}$ at the sensing element varying with time as a triangle wave.

FIG. 7B shows a graph of the sensed resistance $R_S$ varying with time as a square wave—due to the field $H_S$ passing above and below $H_{TR}$, corresponding to FIG. 7A.

FIG. 7C shows a graph of the sensed magnetic field $H_S$ varying with time due to the excitation field $H_{DRIVE}$ varying with time as a triangle wave, and with a DC shift in $H_S$.

FIG. 7D shows a graph of the sensed resistance $R_S$ varying with time as a square wave—due to the field $H_S$ passing above and below $H_{TR}$, corresponding to FIG. 7C.

DESCRIPTION OF PREFERRED EMBODIMENTS

Figure 3A:
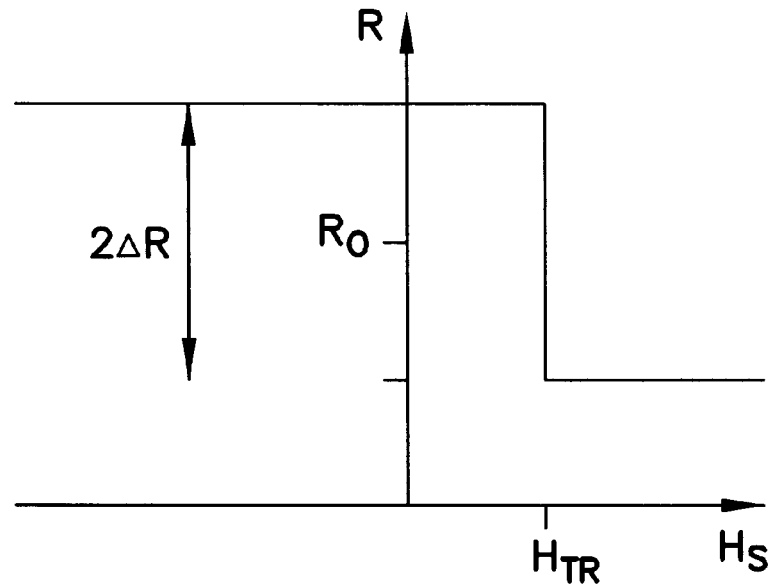
FIG. 3A shows a typical idealized graph of resistance R versus magnetic field $H_S$ for an asymmetric-resistance magnetoresistance device.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

On first examination, the fact that the magnetization state of the soft layer (for either AMR or GMR sensors) depends on its magnetic history would seem to limit applications to those where the fields are larger than $H_{SAT}$. However, many techniques have been developed to minimize the effects of magnetic history on such devices. Wheatstone bridge, DC biasing, small signal AC biasing, and magnetic feedback approaches have been used to construct magnetoresistive devices with sensitivities much smaller than the saturation field. Many of these techniques rely on the measurements of the resistance while the ferromagnetic material is in an unsaturated state. Since measurements of ferromagnetic materials in the unsaturated state are, to some extent, history dependent, the effects of the magnetic history on the measurements still present problems in measuring magnetic fields. The present invention provides an alternative approach to magnetic field sensing, herein called "saturation-excitation magnetoresistive" ("SEMR") sensing.

FIG. 1 is an isometric block diagram of a compass system 100 according to the present invention using three saturation-excited magnetoresistance ("SEMR") sensors 200x, 200y, and 200z. FIG. 1 shows three orthogonal directions x, y, and z, that are, for example, fixed relative to a measurement frame of reference, say a vehicle-, an aircraft-, or a wrist-mounted electronic compass instrument that is measuring the geomagnetic field of the earth. In one embodiment, compass system 100 is used to determine the direction of geomagnetic north, by measuring the x, y, and z components of the applied environmental geomagnetic field, denoted $H_{AP}$. In the embodiment shown, signals representing the magnitude of the x, y, and z components are supplied to computer 110 by SEMR sensors 200x, 200y, and 200z, respectively. In the embodiment shown, accelerometer 112 provides an indication of the vertical orientation of compass system 100, in order that computer 110 can determine the horizontal component of the direction "north." In the embodiment shown, computer 110 drives a signal that controls display 114 for displaying an indication of the geomagnetic orientation of compass system 100, for example, providing an analog pointer to north, or providing a numerical angle, e.g., 32.8° from north. Also shown are control signals 111 which, in one embodiment, are used to drive auto-pilot navigation controls.

In another embodiment, compass system 100 includes only two orthogonally oriented SEMR sensors 200. In such a system, mechanical means are employed to arrange the two SEMR sensors in a horizontal plane, for example, a wrist-mounted compass system 100 is held horizontally by its user.

In yet another embodiment, non-computer-implemented electro-mechanical means (e.g., an analog circuit) are substituted for computer 110 used to convert the output signals from SEMR sensors 200 into a usable display and/or control signal.

FIG. 2A is a top view, and FIG. 2B is a side view, each showing a SEMR sensor element 210, including substrate 214, magnetoresistive ("MR") strip or element 211, insulating layer 213, and excitation strip 212. In one embodiment, MR strip includes a giant magnetoresistive (GMR) device. In one embodiment, the width of MR strip 211 is 10 microns, and the active region 218 is 20 to 2000 squares long (i.e., 200 to 20,000 microns, respectively, for a 10 micron-wide strip). Here, the excitation strip 212 is typically a high-conductivity strip of copper, and typically 1 micron thick and 30 microns wide covering the active region 218 of MR strip 211. Excitation strip 212 is used to generate a magnetic excitation field $H_{DRIVE}$ in the direction shown through the active region 218 of MR strip 211. Connection terminals 217 provide electrical contact to excitation strip 212. In another embodiment, an external coil is provided as the excitation structure (replacing excitation strip 212) to provide the excitation magnetic field in the direction shown in FIGS. 2A–2B. The purpose of magnetic excitation field $H_{DRIVE}$ is explained below. In this embodiment MR strip 211 includes current-drive terminals 216 into which a sense drive signal is provided in order to induce a voltage drop across the active region 218 of MR strip 211, and voltage-sense terminals 215 used to sense the induced voltage drop. Due to the magnetoresistance of MR strip 211, the active resistance $R_{active}$ will vary as a function of magnetic field in the direction shown for $H_{DRIVE}$. In one embodiment, the parasitic resistance $R_{parasitic}$ in the current-drive terminal 216 arms is minimized by keeping the length of those arms as short as possible, and the effects of parasitic resistance $R_{parasitic}$ in voltage-sense terminal 215 arms is minimized by minimizing the current flow in those arms.

FIG. 2C is a top view showing a MR strip 211 and showing the active resistance $R_{active}$ and parasitic resistances $R_{parasitic}$ and the active region 218 and parasitic regions 219.

Figure 3B:
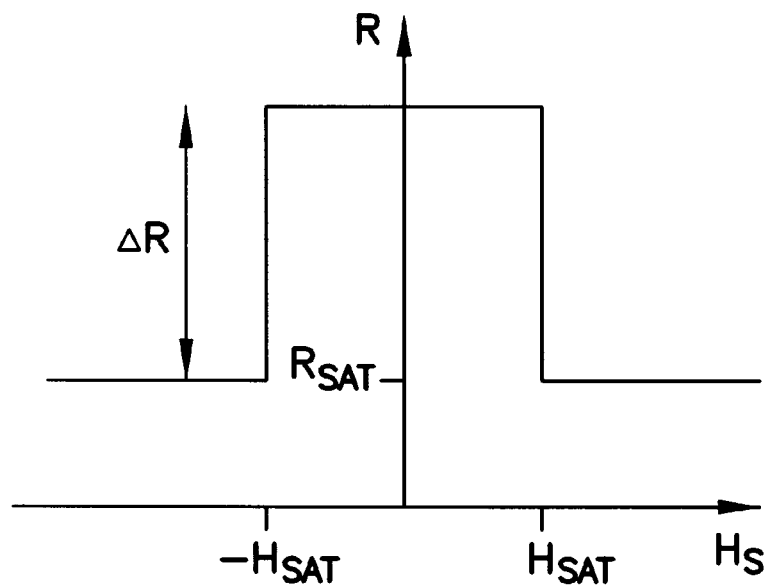
FIG. 3B shows a typical idealized graph of resistance R versus magnetic field $H_S$ for a symmetric-resistance magnetoresistance device.

FIG. 3A shows a typical idealized graph of resistance R versus magnetic field $H_S$ for an asymmetric-resistance magnetoresistance device. Here, "asymmetric-resistance MR" means that the resistance-versus-field transfer function of the material is asymmetric (has different resistances in the two antiparallel saturation states for fields applied along a particular axis). This asymmetric transfer function usually holds only for a limited field range of weak magnetic fields (e.g., $|H_S|<50$ Oe), which complicates the design of devices using such materials. FIG. 3B shows a typical idealized graph of resistance R versus magnetic field $H_S$ for a symmetric-resistance magnetoresistance device. Here, "symmetric-resistance MR" means that the resistance-versus-field transfer function of the material is symmetric (has substantially the same resistance in the two antiparallel saturation states for fields applied along a particular axis) around the field axis for hysteresis curves which saturate the switching ferromagnetic regions for fields applied along a particular axis. Conventional AMR (anisotropic magnetoresistance) materials such as NiFe display symmetric-resistance MR with a peak-to-valley resistance change of around 2%. GMR materials may display either symmetric-resistance MR or asymmetric-resistance MR behavior, with typical resistance changes of 1–100% and 1–10% respectively. Both symmetric-resistance and asymmetric-resistance MR materials may display hysteresis (magnetic history effects) in the resistance-versus-field transfer function.

In one embodiment, MR strip 211 of FIGS. 2A–2B includes a substantially symmetric-resistance MR material while in another embodiment MR strip 211 includes a substantially asymmetric-resistance MR material. FIGS. 4A–4F and 4H and 4J each show a cross-section of a different embodiment that may be used for MR strip 211 of FIGS. 2A and 2B.

Below we refer to "hard" and "soft" layers to describe the ease of rotating the magnetization direction of a ferromagnetic layer. A "soft layer" is one which can be influenced by weak magnetic fields, on the order of 50 Oe or less. A "hard layer" is one which needs stronger magnetic fields to rotate, on the order of several hundred Oe. The hardness or softness of a ferromagnetic layer can be influenced by several factors, including the chemical composition, atomic arrangement, layer thickness or neighboring ferromagnetic or antiferromagnetic layers.

Figure 4A:
FIG. 4A is a cross-section side view of an AMR strip 400 having a single soft layer 401.

FIG. 4A is a cross-section side view of an AMR strip 400 having a single soft layer 401 constructed in a manner similar to conventional AMR sensor devices. Various embodiments of AMR strip 400 include other conventional magnetoresistance or magnetoimpedance materials. Certain embodiments of MR strip 211 (in FIGS. 2A–2B, 8A–8D, and/or 9A–9B) according to the present invention include an AMR strip 400 in the active region between the two voltage sensing arms 215.

Figure 4B:
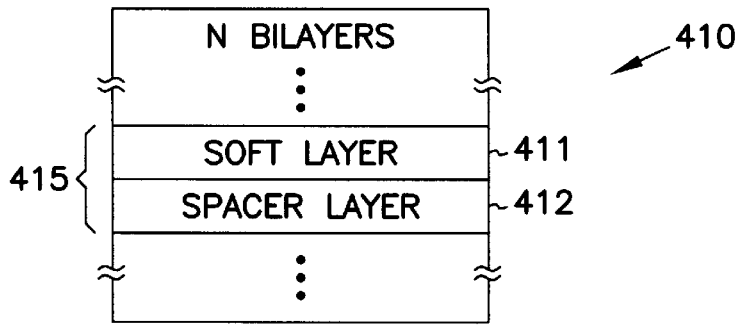
FIG. 4B is a cross-section side view of a GMR strip 410 having a stack of N bilayers 415 each including a soft layer 411 and spacer layer 412.

FIG. 4B is a cross-section side view of a GMR strip 410 constructed in a manner similar to conventional GMR sensor devices having a stack of N bilayers 415, each bilayer 415 including a soft layer 411 and spacer layer 412. In one embodiment, soft layer 411 is 60 Å NiFe (for this entire patent disclosure, the material denoted "NiFe" represents the class of $Ni_xFe_{1-x}$ alloys known as permalloy, where typically x=0.20), and spacer layer 412 is 30 Å copper (Cu). Certain embodiments of MR strip 211 (in FIGS. 2A–2B, 8A–8D, and/or 9A–9B) according to the present invention include a GMR strip 410 in the active region between the two voltage sensing arms 215.

Figure 4C:
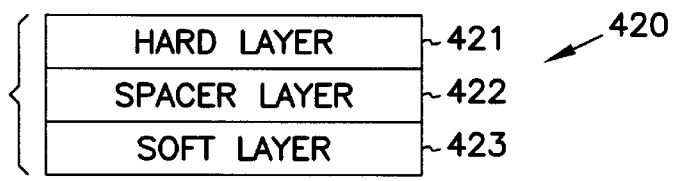
FIG. 4C is a cross-section side view of a GMR strip 420 having a hard layer 421 and a soft layer 423 separated by a spacer layer 422.
Figure 5A:
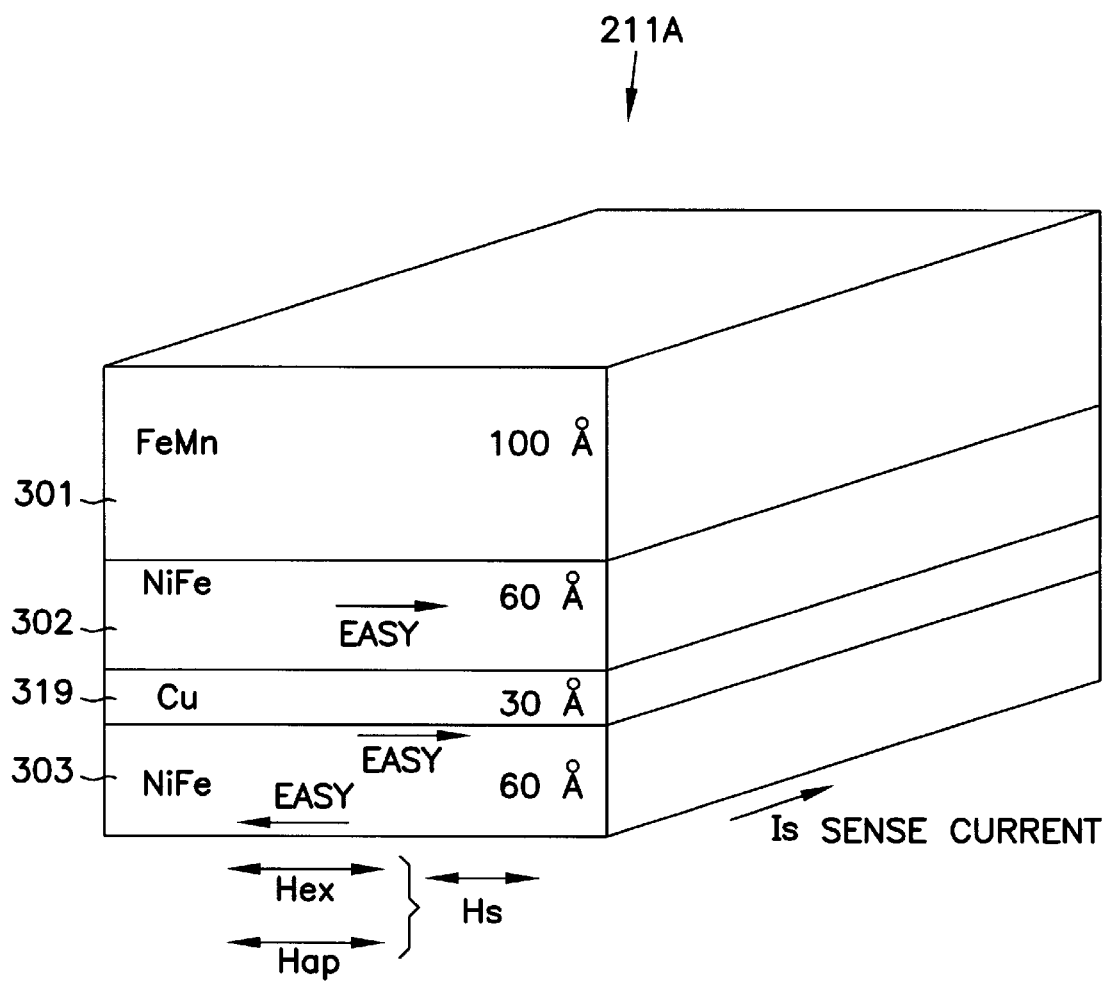
FIG. 5A is an isometric view showing a section of an MR strip 211A, and the directions of sense current versus detected magnetic field.

FIG. 4C is a cross-section side view of a GMR strip 420 constructed in a manner similar to conventional GMR sensor devices having a hard layer 421 and a soft layer 423 separated by a spacer layer 422. In one embodiment, hard layer 421 is a structure that includes a pinned bilayer such as layers 301 and 302 as shown in FIG. 5A; spacer layer 422 is 30 Å copper (Cu); and soft layer 423 is 60 Å NiFe as shown in FIG. 5A. Certain embodiments of MR strip 211 (in FIGS. 2A–2B, 8A–8D, and/or 9A–9B) according to the present invention include a GMR strip 420 in the active region between the two voltage sensing arms 215.

Figure 4D:
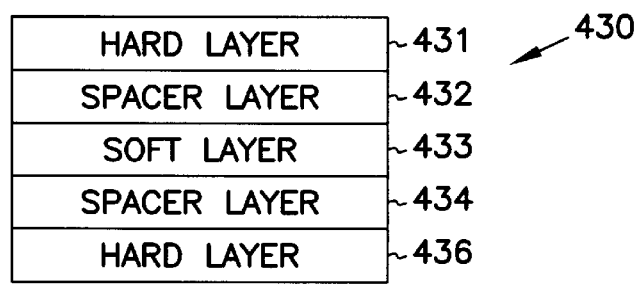
FIG. 4D is a cross-section side view of a GMR strip 430 having an upper hard layer 431 and a central soft layer 433 separated by an upper spacer layer 432, and a lower hard layer 436 separated from the central soft layer 433 by a lower spacer layer 434.

FIG. 4D is a cross-section side view of a GMR strip 430 constructed in a manner similar to conventional GMR sensor devices having an upper hard layer 431 and a central soft layer 433 separated by an upper spacer layer 432, and a lower hard layer 436 separated from the central soft layer 433 by a lower spacer layer 434. In one embodiment, hard layer 431 includes a pinned bilayer such as layers 301 and 302 as shown in FIG. 5A; spacer layers 432 and 434 are each 30 Å copper (Cu); soft layer 433 is 60 Å NiFe as shown in FIG. 5A; and hard layer 436 includes a pinned bilayer such as layers 301 and 302 but in the reverse order as shown in FIG. 5A. Certain embodiments of MR strip 211 (in FIGS. 2A–2B, 8A–8D, and/or 9A–9B) according to the present invention include a GMR strip 430 in the active region between the two voltage sensing arms 215.

Figure 4E:
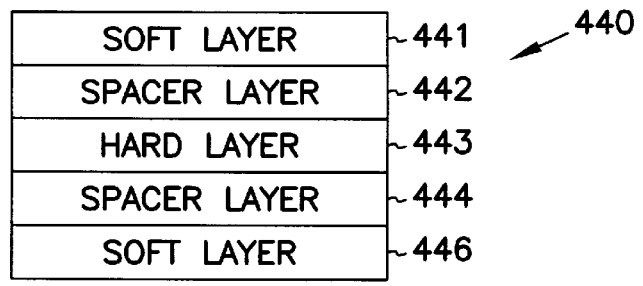
FIG. 4E is a cross-section side view of a GMR strip 440 according to the present invention having an upper soft layer 441 and a central hard layer 443 separated by an upper spacer layer 442, and a lower soft layer 446 separated from the central hard layer 443 by a lower spacer layer 444.

FIG. 4E is a cross-section side view of a novel GMR strip 440 according to the present invention having an upper soft layer 441 and a central hard layer 443 separated by an upper spacer layer 442, and a lower soft layer 446 separated from the central hard layer 443 by a lower spacer layer 444. In one embodiment, soft layers 441 and 446 are each 100 Å NiFe (permalloy), spacer layers 442 and 444 are each 35 Å Cu (copper), and hard layer 443 is 10 Å Co (cobalt). Certain embodiments of MR strip 211 (in FIGS. 2A–2B, 8A–8D, and/or 9A–9B) according to the present invention include a GMR strip 440 in the active region between the two voltage sensing arms 215.

One typical embodiment of a multilayered spin-valve magnetoresistance structure comprises two ferromagnetic layers separated by a nonmagnetic layer. The spin-valve magnetoresistive effect occurs when electronic carriers leave one ferromagnetic layer, traverse the nonmagnetic layer and interact with the other ferromagnetic layer. One or all such ferromagnetic layers in the structure may actually consist of two strongly coupled ferromagnetic layers, where the layer in contact with the nonmagnetic layer is relatively thin (<1 nm). The purpose of the thin ferromagnetic layer is to produce a localized region whose spin-dependent scattering properties are different from the layer of ferromagnetic material into which the localized regions are introduced. This is often found to increase the magnetoresistance of the structure with little degradation of the switching properties.

Figure 4F:
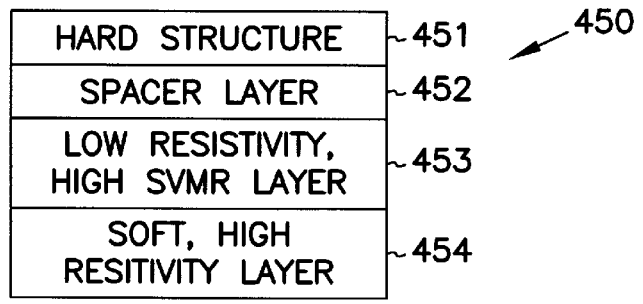
FIG. 4F is a cross-section side view of a GMR strip 450 according to the present invention having a hard layer 451 and a low resistivity, high-SVMR-response layer 453 separated by a spacer layer 452, and a soft, high-resistivity layer 454 next to the low resistivity, high-SVMR-response layer 453.
Figure 5B:
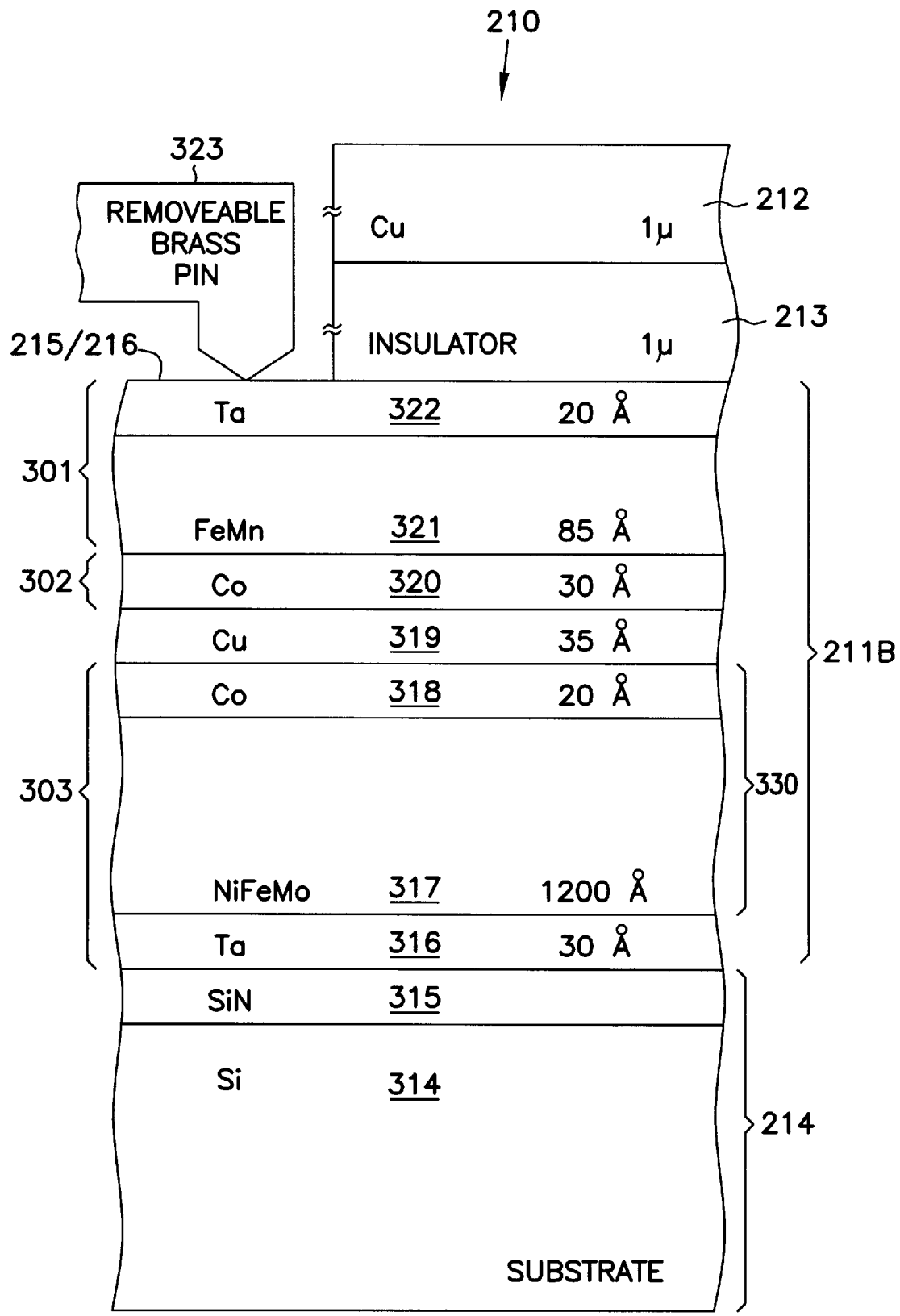
FIG. 5B is a cross-section view showing one embodiment of MR strip 211B within an MR sensor 210.

FIG. 4F is a cross-section side view of a GMR strip 450 according to the present invention having a hard layer 451 (hard layer 451 may include a structure of two (2) or more sub-layers, e.g., a pinned bilayer such as layers 321 (e.g., 85 Å iron manganese (FeMn)) and 320 (e.g., 30 Å cobalt (Co)) of FIG. 5B) and a low resistivity, high-SVMR-response layer 453 (e.g., 20 Å cobalt (Co)) separated by a spacer layer 452 (e.g., 30 Å copper (Cu)), and a soft, high-resistivity layer 454 (e.g., 1200 Å nickel-iron-molybdenum (NiFeMo)) next below the low resistivity, high-SVMR-response layer 453. Certain embodiments of MR strip 211 (in FIGS. 2A–2B, 8A–8D, and/or 9A–9B) according to the present invention include a GMR strip 450 in the active region between the two voltage sensing arms 215.

Figure 4G:
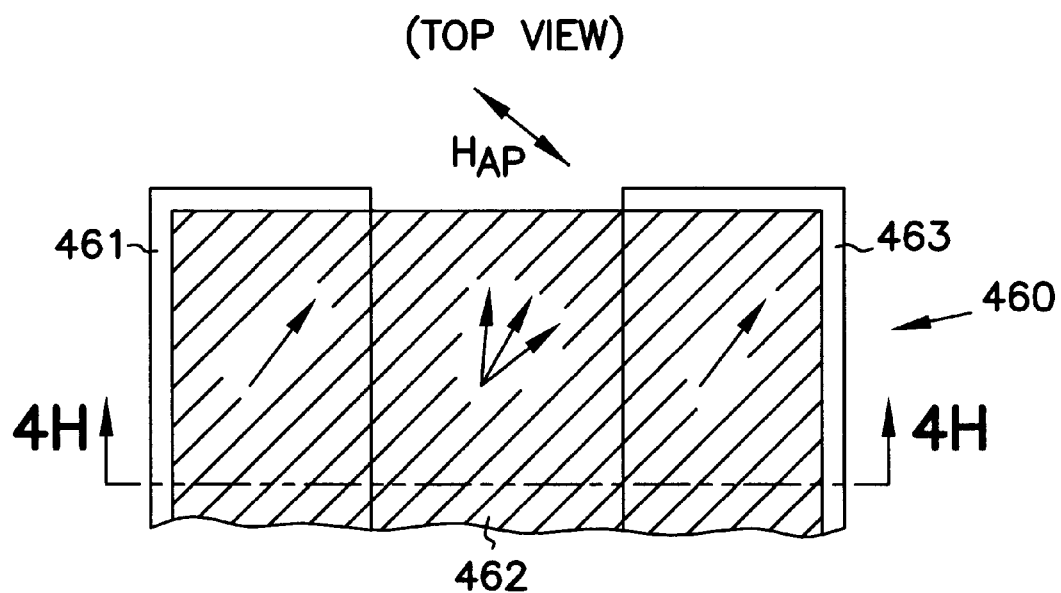
FIG. 4G is a top view of a MR strip 460 having a soft layer 462 having a central lateral soft area 466 between pinned end 465 and pinned end 467.
Figure 4H:
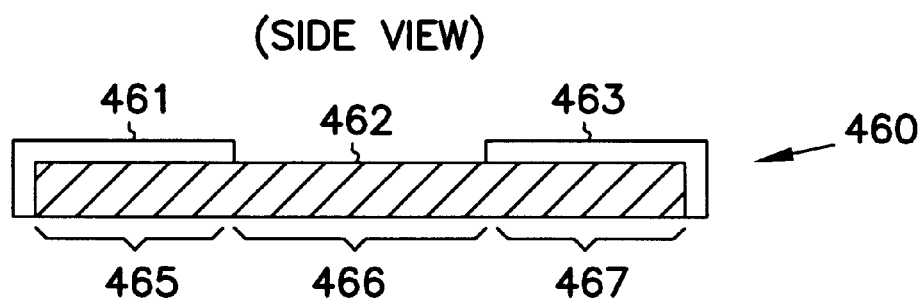
FIG. 4H is a cross-section side view of the MR strip 460 shown in FIG. 4G, showing pinning layers 461 and 463 for pinned end 465 and pinned end 467, respectively.

FIG. 4G is a top view of an MR strip 460 having a soft layer 462 having a central lateral soft area 466 between pinned end 465 and pinned end 467. FIG. 4H is a cross-section side view of the MR strip 460 shown in FIG. 4G, showing pinning layers 461 and 463 for pinned end 465 and pinned end 467, respectively. Certain embodiments of MR strip 211 (in FIGS. 2A–2B, 8A–8D, and/or 9A–9B) according to the present invention include an MR strip 460 in the active region between the two voltage sensing arms 215.

Figure 4I:
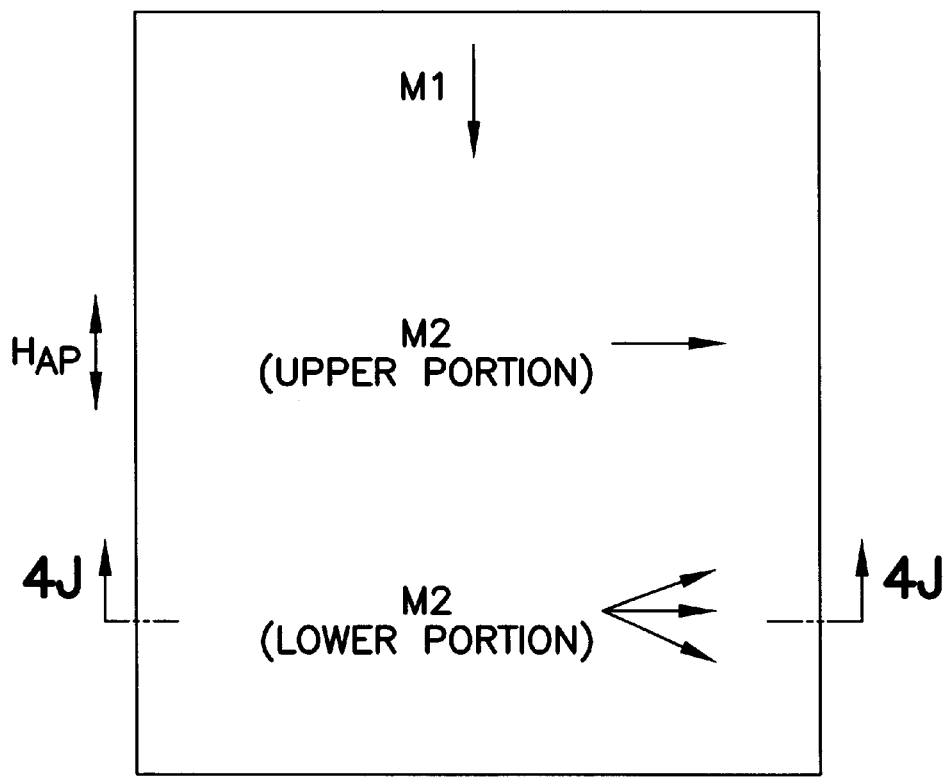
FIG. 4I is a top view of a GMR strip 470 according to the present invention showing the magnetization direction of M1 layer 476, the magnetization direction of the pinned upper part 472 of M2 layer 475, and the various magnetization directions of the soft lower part 473 of M2 layer 475.

FIG. 4I is a top view of a GMR strip 470 according to the present invention showing the magnetization direction of M1 layer 476, the magnetization direction of the pinned upper part 472 of M2 layer 475, and the various magnetization directions of the soft lower part 473 of M2 layer 475. The M2 layer 475 is designed to have a transition between the hard (or pinned) upper layer 472 and the soft lower layer 473. In one embodiment, a sharp transition is provided; in another embodiment, a gradual transition is provided. In one embodiment, this transition is accomplished by providing a thick M2 layer, so that the pinning process only affects the upper portion (i.e., upper layer 472). In another embodiment, separate layers are deposited in order to provide a hard layer 472 and a soft layer 473.

Figure 4J:
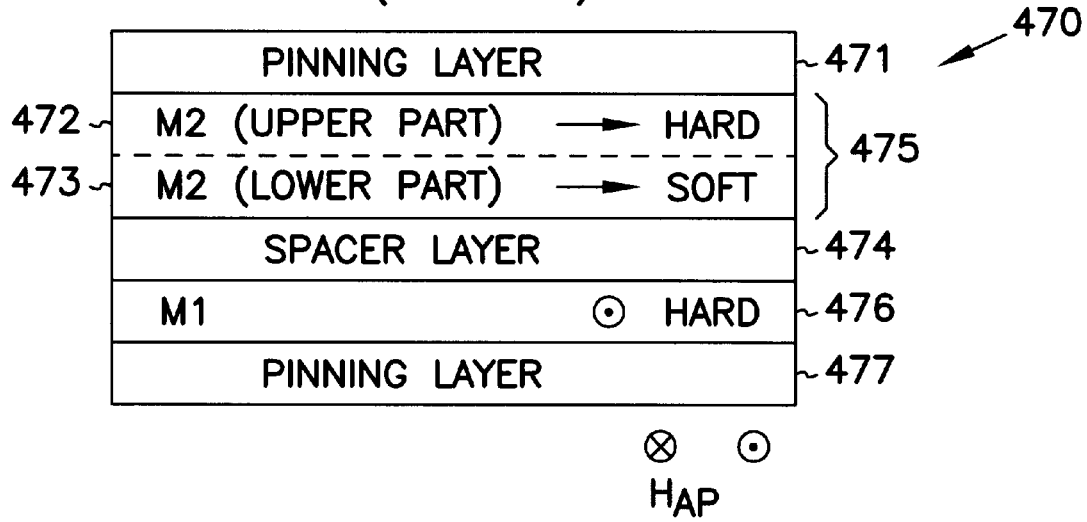
FIG. 4J is a cross-section side view of a GMR strip 470 according to the present invention showing pinning layer 471, M2 layer 475, spacer layer 474, hard M1 layer 476, and pinning layer 477.

FIG. 4J is a cross-section side view of a GMR strip 470 according to the present invention showing pinning layer 471, M2 layer 475, spacer layer 474, hard M1 layer 476, and pinning layer 477. Pinning layer 477 pins the entire 476 layer; in one embodiment, to the direction coming out of the figure in FIG. 4J, and to the light in FIG. 4I as shown, ideally substantially parallel to the direction of the field to be measured, $H_{AP}$. In contrast, pinning layer 471 is designed, along with layer 475, to pin only the adjacent portion of M2 layer 475 (i.e., the upper surface and portion 472 in the structure shown in FIG. 4J) while leaving the further-away portion (i.e., the lower surface and portion 473) remains relatively soft and unpinned. Certain embodiments of MR strip 211 (in FIGS. 2A–2B, 8A–8D, and/or 9A–9B) according to the present invention include a flexible MR strip 470 in the active region between the two voltage sensing arms 215.

In one embodiment, a symmetric-resistance MR strip 211 (of FIGS. 2A and 2B) includes a single layer of anisotropic magnetoresistance (AMR) material such as NiFe, as shown in FIG. 4A. In another embodiment, a symmetric-resistance MR strip 211 includes a multilayer structure of GMR materials such as alternating layers of ferromagnetic and nonmagnetic materials such as Co and Cu with thicknesses 1–100 Å as shown in FIG. 4B. These more complicated structures often have higher magnetoresistance values than the single AMR layers, but tend to be more difficult to produce.

In other embodiments, an asymmetric MR element 211 (of FIGS. 2A and 2B) is used, of which FIGS. 4C, 4D, 4E and 4I–J are examples. In each case, one or several hard layers are designed to have a certain, stationary magnetization direction as long as the sensor field is kept smaller than some known field (typically $|H_S|$<50 Oe). The nearby soft layer or layers are designed to be much more sensitive to applied fields. Therefore, weak applied fields will affect only the soft layers, changing the relative angle between the magnetization states of the hard and soft layers. This change in the relative angle produces the change in resistance of the total structure.

The structure in FIG. 4C accomplishes this using only a single soft and a single hard layer. While easy to produce, this design suffers since only one interface region exists where the electrons of the hard and soft layers can interact. The structure in FIG. 4D improves on this design by including two interface regions. Such structures have produced higher magnetoresistance responses compared to FIG. 4C structures. However, the soft layer 433 typically has inferior soft magnetic properties, probably due to thickness and deposition restrictions. In particular, the soft layer thickness is limited to less than about 40 Å to maintain a large magnetoresistance response, and its crystal structure will be strongly affected by the adjacent upper and lower layers. In addition, the central layer should be composed of a high conductivity material, which limits the range of useful materials.

The present invention illustrated in FIG. 4E improves upon this design by placing the soft layers on the outside of the structure. In this way the restriction upon the thickness of the soft layer is eased, while retaining the advantage of two hard layer/soft layer interface regions. The outer soft layers can be engineered to have soft magnetic properties without altering the electron transport mechanisms responsible for the magnetoresistance.

Another way to improve upon the FIG. 4C structure is to optimize the properties of the soft layer 423. Below are described two such methods. In one embodiment the soft layer 423 is replaced with a bilayer structure such as shown in FIG. 4F to optimize the soft magnetic properties and magnetoresistive properties simultaneously. In another embodiment, the soft layer 423 of FIG. 4C is replaced by a layer 475 of FIG. 4J that is partially pinned (i.e., a pinning layer on one surface pins that surface to produce a hard-magnetization-portion layer having a hard magnetization, the rest of the layer, either gradually or abruptly, transitions to a soft-magnetization-portion layer located between the spacer layer 474 and the hard-magnetization-portion layer 472 and adjoining each), such as in the embodiment shown in FIGS. 4I and 4J, in a way that optimizes the smoothness of the magnetization rotation, thus reducing undesirable effects such as Barkhausen noise. This sensor device 470 of FIGS. 4I and 4J thus provides improved noise performance when used in a read head in a magnetic disk drive or other magnetic-recording device, one embodiment of the present invention.

FIG. 4F illustrates one embodiment of the present invention, wherein the soft layer 423 of a GMR strip such as shown in FIG. 4C in replaced by two layers: a soft, high-resistivity ferromagnetic layer 454 and a hard, low-resistivity ferromagnetic layer 453, each serving a function. The soft, high-resistivity ferromagnetic layer 454 is designed to have a magnetization whose direction is easily rotated by an applied field and to couple very strongly to layer 453 that has high spin-valve magnetoresistance characteristics. Since the spin-valve resistance mechanism takes place primarily in the hard, low-resistivity layer 453, the transport properties of the soft layer 454 are relatively unimportant to the magnetoresistance, thus allowing the soft switching properties of layer 454 to be better optimized than would be the case otherwise.

The present invention asymmetric MR structure illustrated in FIGS. 4I–4J is motivated by a well-known weakness in magnetic sensing materials: inhomogeneous rotation of magnetization due to an applied field. Ferromagnetic materials are often divided into domains, where various domains have different magnetization vectors. This occurs because the magnetostatic energy of the divided state is lower than the homogenous state, or because there are different kinetic barriers for rotation in different parts of the material. The implication is that applications which require the ferromagnetic material to respond to an applied field will be plagued with noise, as the various ferromagnetic regions overcome their individual kinetic barriers.

One technique for overcoming this weakness is to bias the switching layer using a nearby antiferromagnet layer as shown in FIGS. 4G–4H. Here the edge regions of sensor 462 have an exchange biasing antiferromagnetic overlayer, while the central active region has no exchange biasing layer. The arrows within the shaded region represent the magnetization vector of the soft layer 462. Notice that the magnetization changes gradually in the lateral directions, but has no vertical variation. The pinned regions 465 and 467 adjacent to the antiferromagnetic layers 461 and 463 respectively have substantially fixed magnetizations, while the magnetization of the central region responds to applied fields. Since the central active region has the 'boundary conditions' of a specific magnetization vector at the boundaries with the pinned regions, there is a reduced tendency for different parts of the active region to rotate independently. The disadvantage of this design is that the biasing is still incomplete, and different parts of the active region could still rotate independently. More complete biasing could be achieved by having the biasing layer cover the entire active region, but that would decrease the sensitivity of the active region to applied fields. Therefore, a need exists for a biasing technique which has the advantages of uniform magnetization rotation together with high sensitivity to applied fields.

The present invention 470 overcomes this problem by taking advantage of the spin valve magnetoresistance effect (FIGS. 4I–4J). Here the entire active sensing region soft layer 475 is biased and placed in proximity to separate hard layer 476. This hard layer 476 is thin (<~50 Å) and assumed to have uniform magnetization throughout its entire thickness. The soft layer 475 is pinned at its upper interface by pinning layer 471 and therefore maintains a constant magnetization direction in that upper region 472. By proper design of the soft layer 475, the lower region 473 can still rotate in response to applied magnetic fields even though the upper region 472 is pinned (thus creating a "flexible" layer, having a hard magnetization on one surface and a soft magnetization on an opposing surface).

One novel aspect of the invention lies in the conscious engineering of the ferromagnetic layer 475 so that this vertical variation in the magnetization can take place in such a flexible layer. To fabricate such a flexible ferromagnetic layer, materials should be selected that couple strongly to magnetic fields and weakly to neighboring spins. Thus, large magnetization constants and small exchange-coupling constants are preferred for layer 475 in order to allow for a vertical variation in magnetization direction. Thus, following this logic, cobalt (Co) would be a more suitable material than nickel (Ni) for soft layer 475, and iron (Fe) would be more suitable than either of the others. This vertical variation in magnetization direction within a ferromagnetic layer is plausible since ferromagnets are known to tolerate domain walls over relatively short distances (~300 Å). Recent data (Miller and Dahlberg, 1997) indicates that vertical variation in the magnetization has been observed in cobalt/cobalt oxide bilayers. One embodiment of the present invention uses such a flexible layer in a magnetic recording system such as a read head in a magnetic disk data storage system.

Another novel aspect of the invention is the recognition that the spin valve magnetoresistance effect for this structure is sensitive primarily to the magnetization direction of the lower soft region 473, rather than to the average magnetization direction of the entire layer 475. This means that the upper region 472 can be very strongly pinned without degrading the magnetoresistance response transfer function. The strong pinning will result in more uniform magnetization state of the lower region 473, in a manner similar to that which takes place in the FIGS. 4G–4H structure. Another embodiment would be to have M2 separated into two or more loosely coupled ferromagnetic layers, with the same effect.

The structure of FIGS. 4I–4J overcomes one major problem of magnetoresistive magnetic field detection at high frequencies (e.g., magnetic disk data reading), that of homogeneous rotation of the MR layer. This homogeneous rotation causes noise, especially in MR sensors used in magnetic data heads. Therefore, one embodiment of the present invention is a magnetic data read head using the loosely pinned layer structure 470 of FIGS. 4I–4J.

To recap, FIGS. 4A–4J describe several embodiments of the MR strip 211. The FIG. 4A structure has the greatest ease of fabrication, the FIG. 4B structure has large MR response, the FIG. 4C structure is an easy to fabricate asymmetric structure, the FIGS. 4D and 4E structures are asymmetric MR structures with larger MR response, and the FIGS. 4F–4J structures incorporate soft ferromagnetic layers with improved switching properties.

In various embodiments of the present invention, the MR strip 211 of FIGS. 2A–2B is fabricated from the structures shown in FIGS. 4A, 4B, 4C, 4D, 4E, 4F, 4G–4H, or 4I–4J.

FIG. 5A is an isometric view showing a section of one embodiment of MR strip 211 (i.e., the MR strip 211A shown) where an asymmetric-resistance GMR structure is used, illustrating the directions of sense current $I_S$ and the sensed component the magnetic field at the sensing element $H_S$. The detailed layer structure of FIG. 5A is one embodiment that corresponds to the generic structure of FIG. 4C. The sensed magnetic field $H_S$ is the component in the direction shown, of the vector sum of the environmental field $H_{AP}$ and the excitation magnetic field $H_{DRIVE}$. In this embodiment, the pinned ferromagnetic layer 302 has its magnetization vector pointed substantially to the right due to the influence of the neighboring antiferromagnetic layer 301. This pinning condition holds as long as the field magnitude at the sample layer below a certain level, typically 100 Oe (this is called a "hard layer" because of the high field, typically over 100 Oe, needed to change it). The switching layer or soft layer 303 is designed to rotate freely due to applied magnetic fields (this is called a "soft layer" because of the low field, e.g., 50 Oe or less, needed to change it). The magnetoresistance effect results from the variation in angle between the magnetization vectors of the pinned layer (301 and 302) and the soft layer (303). In one such embodiment, MR strip 211A includes pinning layer 301 that is 100 Å of FeMn (iron-manganese, typically 50% Fe and 50% Mn), pinned layer 302 that is 60 Å of NiFe (typically 80% Ni and 20% Fe), spacer layer 319 that is 30 Å of Cu, and soft layer 303 that is 60 Å of NiFe (typically 80% Ni and 20% Fe). Typically, MR strip 211A is heated in a DC applied magnetic field in order that pinning layer 301 and pinned layer 302 couple to produce and anneal an "easy" ("pinned") direction of magnetization in the direction shown.

Figure 5C:
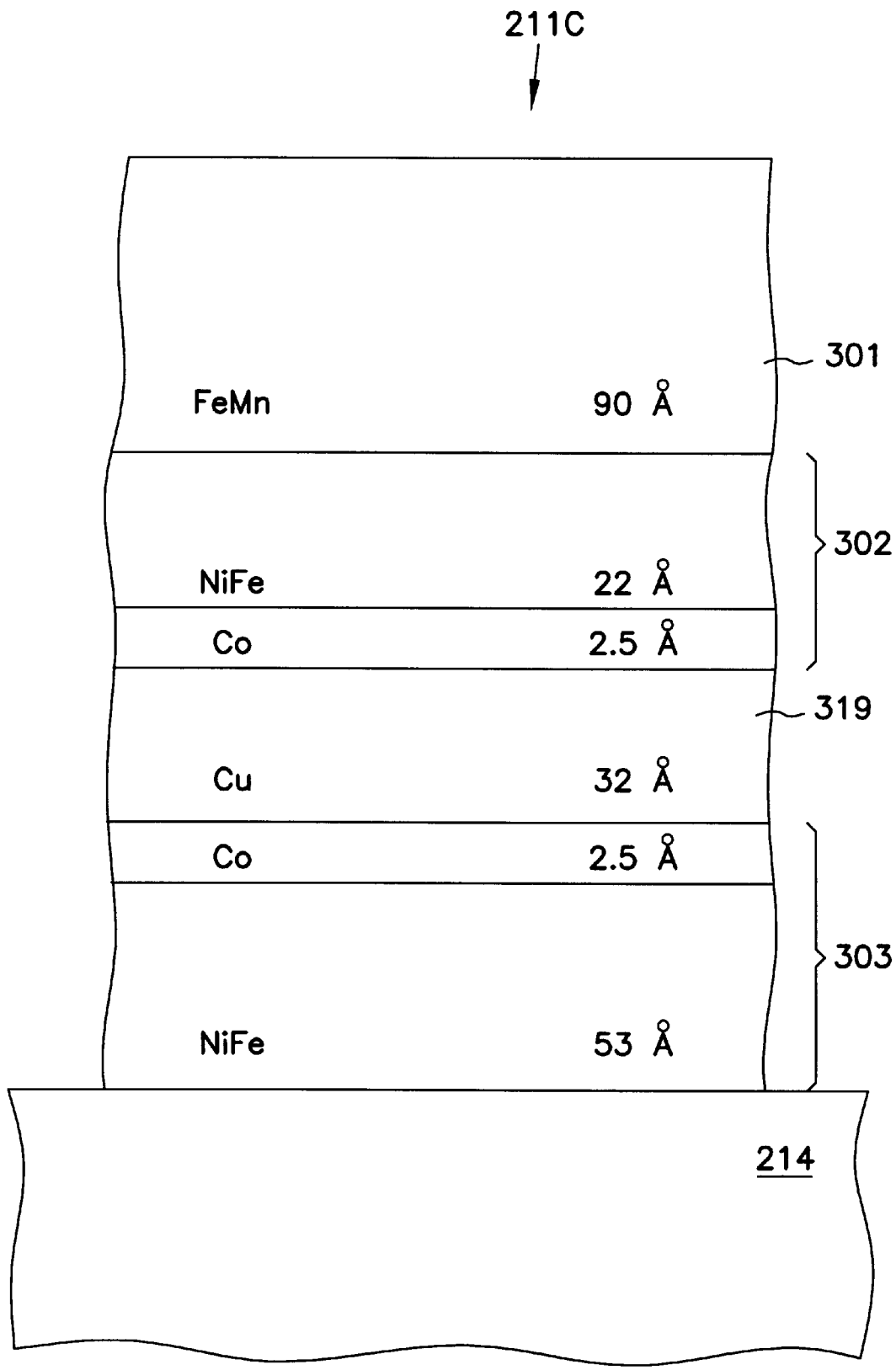
FIG. 5C is an cross-section view showing a section of an MR strip 211C.
Figure 5D:
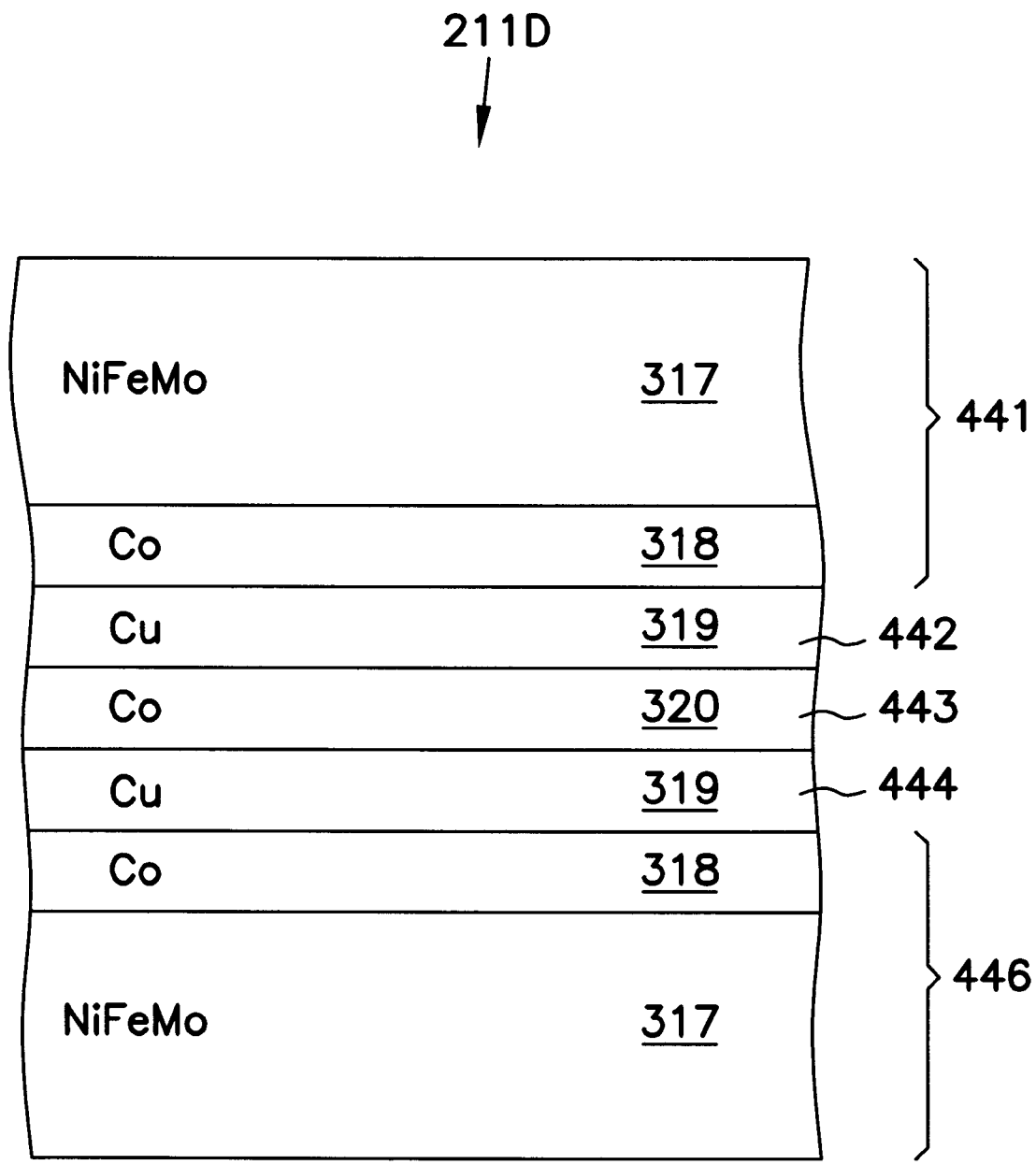
FIG. 5D is an cross-section view showing a section of an MR strip 211D according to the present invention.

Spin-valve (or GMR) magnetoresistive structures often contain ferromagnetic layers designed to rotate easily in response to a magnetic field. Ideally, structures for certain applications have soft ferromagnetic layers which are as soft (i.e., easily rotated by an applied field) as possible, while also having the largest-percentage resistance change due to the rotation of the soft layer. In previous devices, these two properties cannot be optimized simultaneously. One common spin-valve structure (FIG. 5C) uses two ferromagnetic layers (302 and 303) separated by a nonmagnetic layer 319.The pinned ferromagnetic layer 302 is pinned by being located adjacent to an antiferromagnetic layer 301 (in one embodiment, 90 angstroms thick). The soft ferromagnetic layer 303 includes two strongly coupled ferromagnetic layers, each serving a purpose. The thick (in one embodiment, 53 angstroms thick) NiFe layer is used since it is known to be a soft ferromagnetic material. The thin (in one embodiment, 2.5 angstroms thick) Co (cobalt) layer is placed at the boundary of the NiFe layer which is exposed to the pinned permalloy layer because it has been observed to increase the resulting magnetoresistance percentage. The technique has been described as "Co dusting".

Bulk materials can sometimes be softer than thin films of the same materials. Thus increasing the thickness increases the softness of magnetic materials, in at least some cases. However, typical thicknesses for the soft layer reported in the literature are less than 100 Å. This is because the GMR effect relies on current carriers traveling between the two ferromagnetic layers (302 and 303). If more material is present to carry current that is distant from the active interfaces, the total GMR (the percentage resistance change) will be decreased. Since increasing the thickness of the soft material (e.g., layer 303) too far will reduce the GMR percentage, there is a practical upper limit to the thickness of soft layers, which limits the sensitivity of the finished device to weak magnetic fields.

Another trend in the literature is that low-resistivity materials are usually used for the soft layer (e.g., layer 303). While not stated explicitly, this is possibly because the GMR mechanism is maximum when the ratio of spin-dependent scattering to spin-independent scattering is large. In this case, the spin dependent scattering is that caused by the relative magnetization states while the spin independent scattering is that caused by all of the other "lossy" mechanisms in the material. Therefore, a low-resistance ferromagnetic material will have relatively little spin independent scattering and should produce a large GMR effect when used in a spin-valve sandwich.

The previous four paragraphs point toward four desirable properties for soft layers: they should principally include soft ferromagnetic material, they should have a thin coating of Co (cobalt) or Co alloy, they should be thin (less than approximately 100 Å), and they should include low-resistivity ferromagnetic materials. The last two conditions can be limiting factors for low-field switching characteristics. In one embodiment of the present invention, by violating both of these conditions simultaneously ON PURPOSE, one achieves superior low-field switching while still keeping a substantial GMR percentage.

FIG. 4F is a generic cross-section side view of a GMR strip 450, according to the present invention, having such an arrangement. GMR strip 450 having a hard layer 451 (e.g., a pinned bilayer such as 301 and 302 of FIG. 5A or 5C) and a low resistivity, high-SVMR-response layer 453 separated by a spacer layer 452, and a soft, high-resistivity layer 454 next to the low resistivity, high-SVMR-response layer 453. FIG. 5B is a cross-section view showing one detailed embodiment of MR strip 211 (i.e., the MR strip 211B shown) according to the present invention having such an arrangement. In this embodiment, substrate 214 includes a silicon substrate 314 having buffer layers of silicon nitride SiN 315 and Ta 316 (in one embodiment, 30 Å tantalum). Soft layer 303 includes high-resistivity soft ferromagnetic layer 317 (in one embodiment, 1200 Å nickel-iron-molybdenum) (typically 80% Ni, 16% Fe, and 4% Mo), and low-resistivity ferromagnetic layer 318 (in one embodiment, 20 Å cobalt). Spacer layer 319 (in one embodiment, 30 Å copper; in other embodiments similar thicknesses of gold, silver, copper, or alloys of these metals). Pinned layer 302 includes Co layer 320 (in one embodiment, 30 Å cobalt). Pinning layer 301 includes FeMn layer 321 (in one embodiment, 60 Å of FeMn). Ta layer 322 (in one embodiment, 20 Å tantalum) is used to prevent oxidation of lower layers. In the embodiment shown, a removable brass pin 323 provides electrical contact to contacts 215 and 216. Also shown are insulator 213 (typically, a one-micron thick layer of silicon oxide, aluminum oxide, polyimide, or other suitable insulator), and excitation strip 212 (typically, a one-micron thick layer of high-conductivity material, such as copper or an alloy of copper).

Figure 8A:
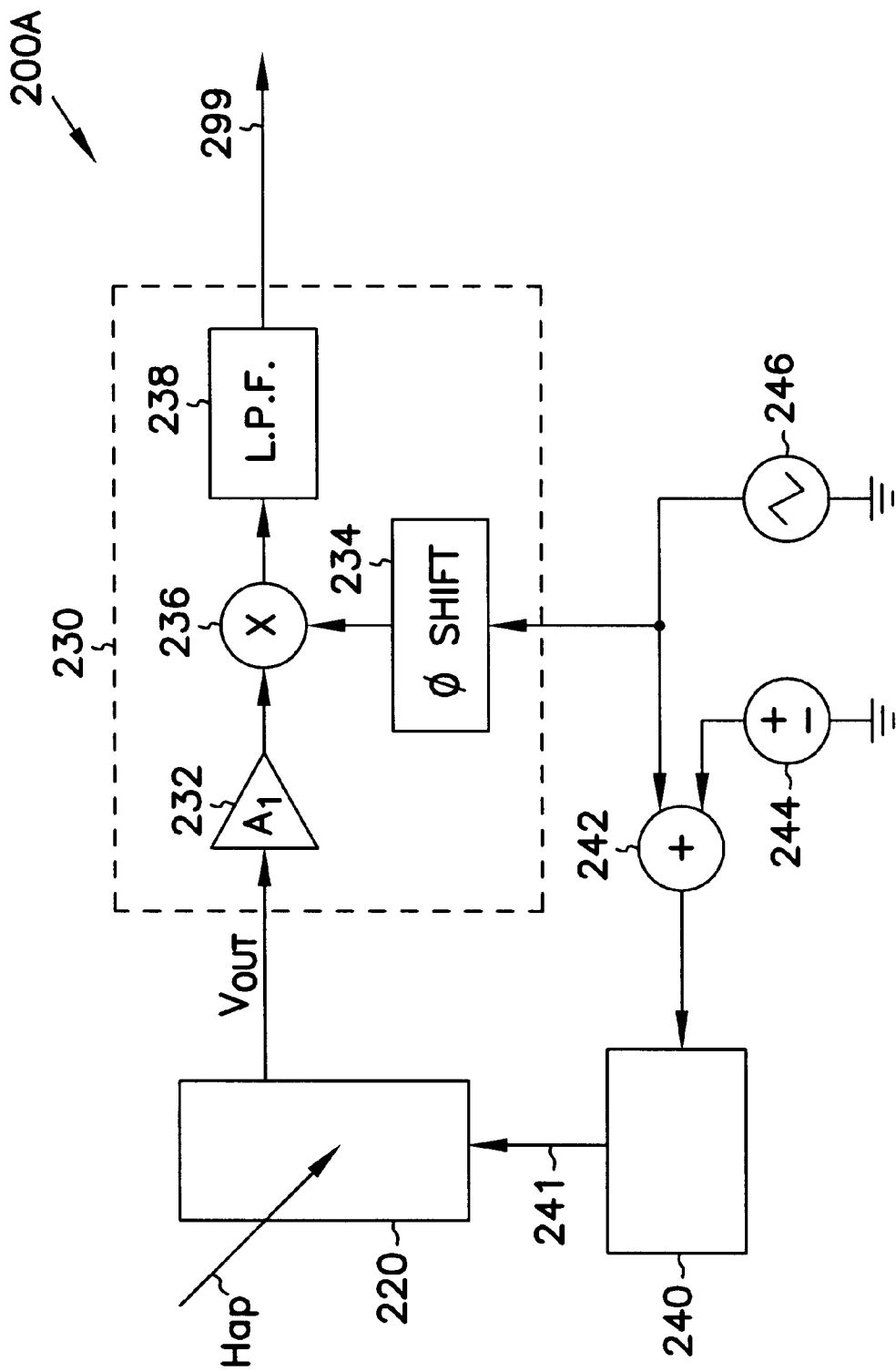
FIG. 8A shows a block diagram of one SEMR sensor 200A according to one embodiment of the present invention.
Figure 8B:
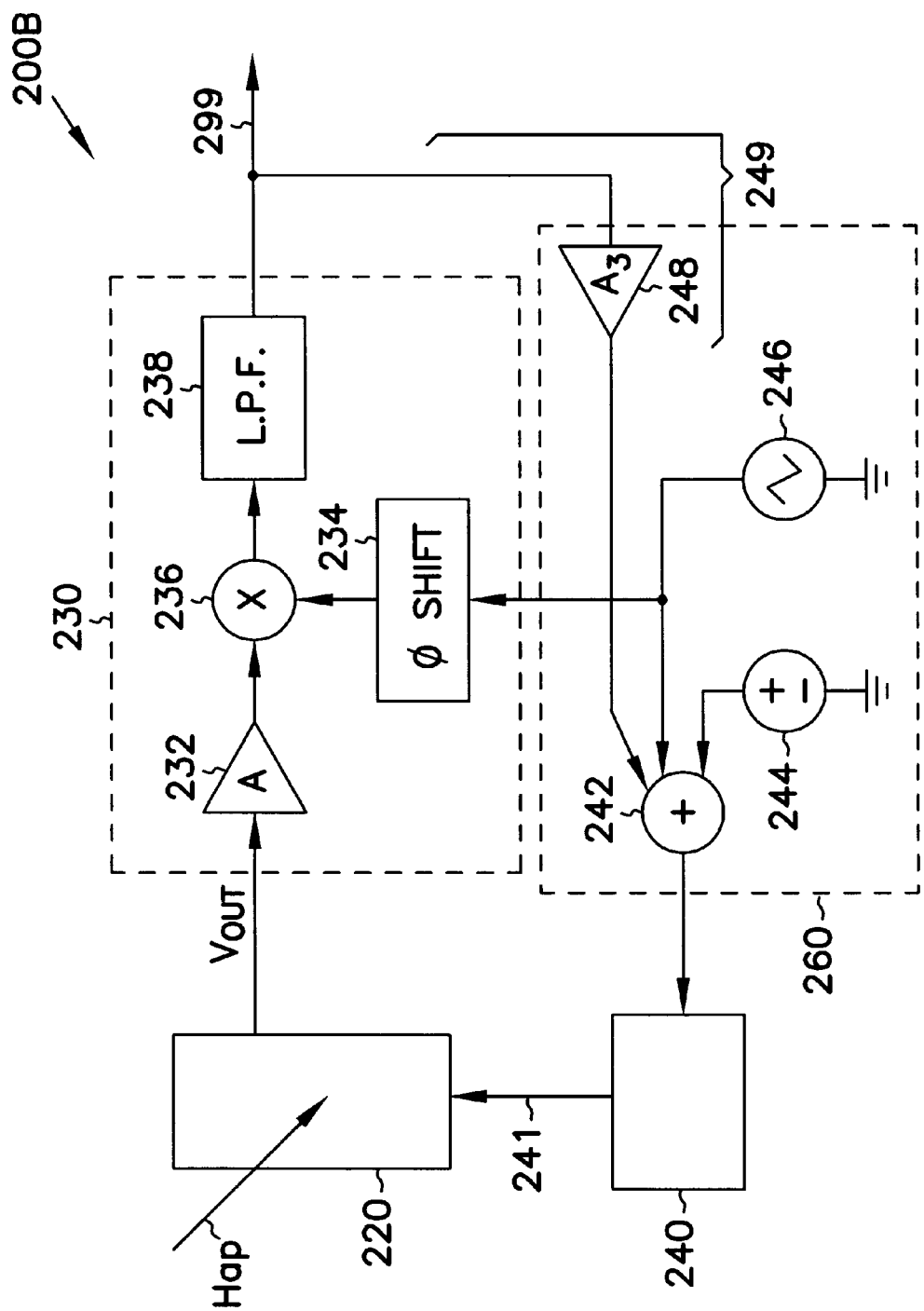
FIG. 8B shows a block diagram of one SEMR sensor 200B with a feedback path according to another embodiment of the present invention.
Figure 8C:
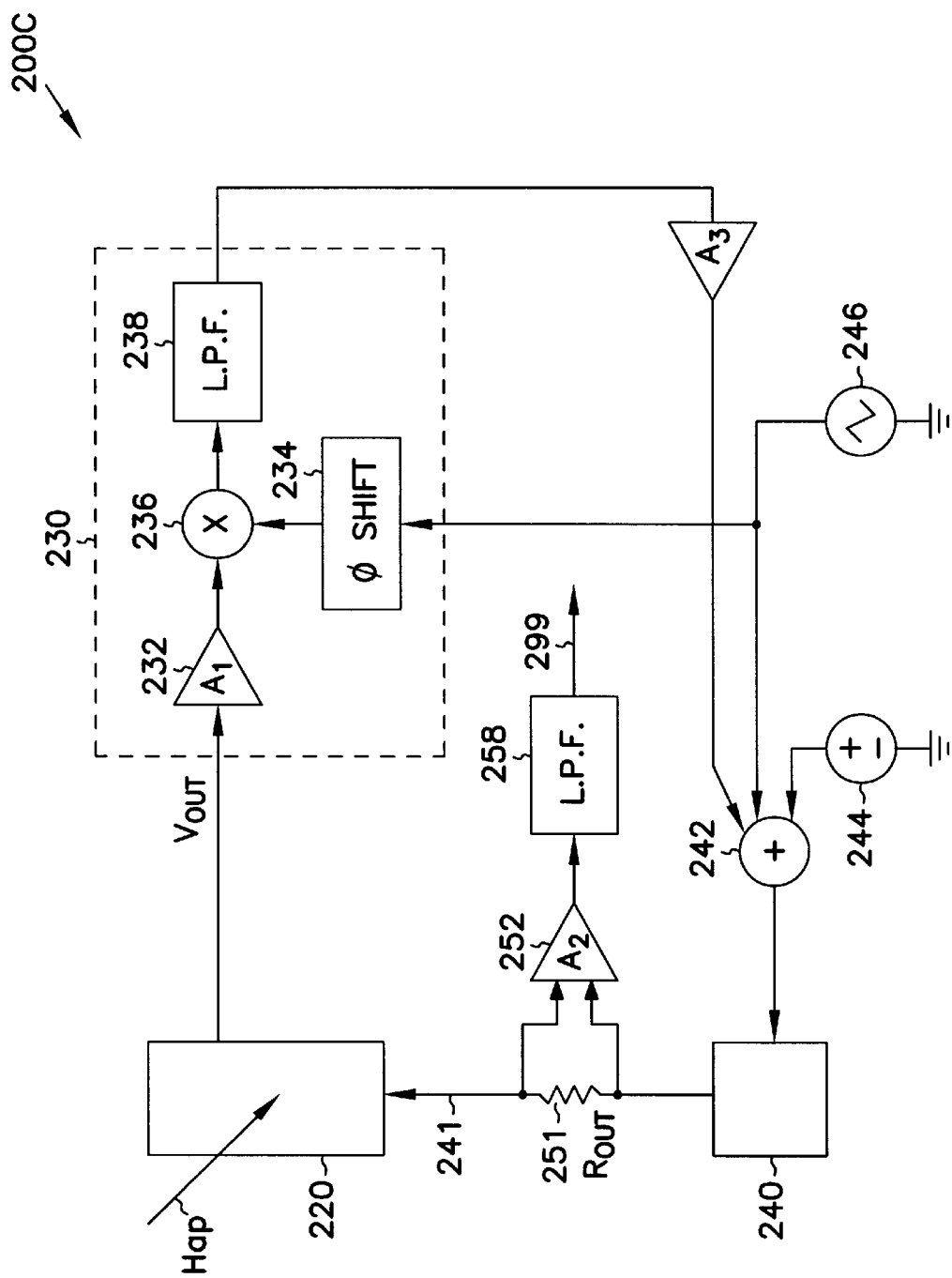
FIG. 8C shows a block diagram of one SEMR sensor 200C according to yet another embodiment of the present invention, deriving the output signal from the drive signal 241.

In the embodiment shown in FIG. 5B, a bilayer structure 330 made from high-resistivity soft ferromagnetic layer 317 and low-resistivity ferromagnetic layer 318, is included in soft layer 303 for use in improving the performance characteristics of the spin-valve magnetoresistive device (e.g., a saturation-excited magnetoresistance SEMR sensor 200 ( such as SEMR 200A of FIG. 8A, SEMR 200B of FIG. 8B, or SEMR 200C of FIG. 8C). In general, bilayer structure 330 includes a thick layer (5–1000 nm) having a high-resistivity soft ferromagnetic material (e.g., high-resistivity soft ferromagnetic layer 317), that is adjacent to a thinner layer (0.2–100 nm) of a low-resistivity ferromagnetic material (e.g., low-resistivity ferromagnetic layer 318). These two layers (the "bilayer" 330) are coupled ferromagnetically at their interface, causing them to possess the same magnetization direction. The high-resistivity material, layer 317, is designed to have extremely soft magnetic properties, which causes the bilayer 330 to rotate easily in response to environmental (e.g., external) magnetic fields. In one embodiment, a NiFeMo alloy (typically 80% Ni, 16% Fe, and 4% Mo) is used for the high-resistivity material. In another embodiment, Fe—Si is used. In yet other embodiments, other related alloys are used. The low-resistivity material, layer 318, is made of a material known to enhance spin valve magnetoresistance, such as Co or Co—Fe alloys. It is believed that the high-resistivity of the soft ferromagnetic layer 317 reduces the current flowing through that layer, particularly for spin-independent electrons, thus increasing the GMR ΔR/R percentage due to spin-dependent electrons, as compared to a high-conductivity material of the same thickness.

Figure 6A:
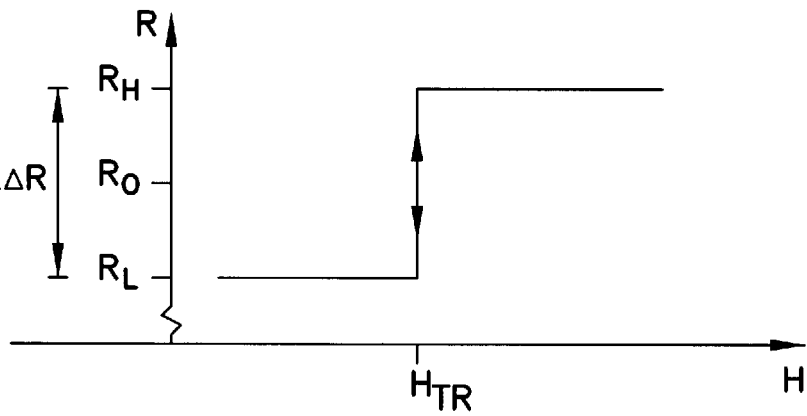
FIG. 6A shows an idealized curve of resistance R versus magnetic field $H_S$ for an asymmetric MR sensing element.

FIG. 6A shows an idealized curve of resistance R versus magnetic field $H_S$ for an asymmetric-resistance MR strip 211. As $H_S$ is changed across a transition field strength, denoted $H_{TR}$, the resistance will change by an amount denoted 2 ΔR. The average resistance of MR strip 211 is denoted $R_0$, which is typically one-half way between the low resistance $R_L$ and the high resistance $R_H$ values. It is typically desired to maximize GMR percentage $\Delta R/R_0$.

Figure 6B:
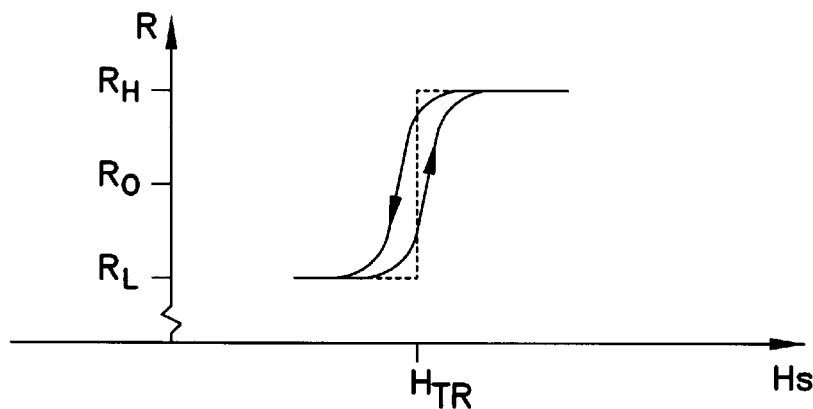
FIG. 6B shows a typical actual curve of resistance R versus magnetic field $H_S$.
Figure 6C:
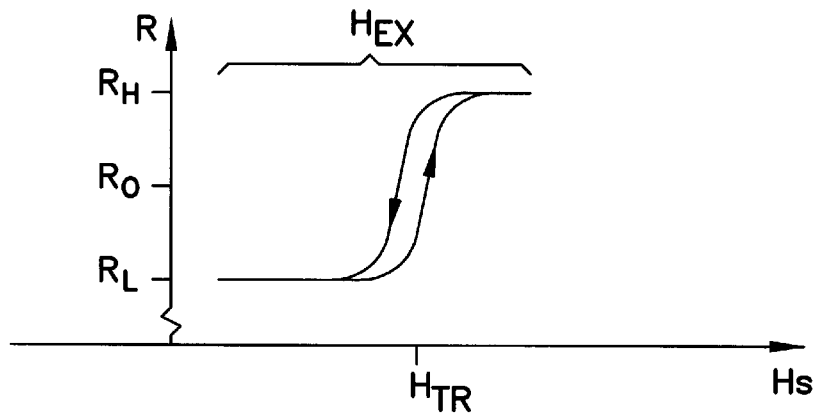
FIG. 6C shows another typical actual curve of resistance R versus magnetic field $H_S$, with a DC shift in $H_S$.

FIG. 6B shows a typical actual curve of resistance R versus magnetic field $H_S$. In comparison to the ideal curve shown in FIG. 6A, the curve of FIG. 6B shows some rounding on the corners of the transition, and some horizontal distance, called "hysteresis", between the curve going "up" as $H_S$ increases across $H_{TR}$, and the curve going "down" as $H_S$ increases across $H_{TR}$. If, as shown in FIG. 6B, the sensed magnetic field, $H_S$, is driven to be a triangle wave centered on $H_{TR}$ (see FIG. 7A, with the sensed magnetic field $H_S$ varying with time due to the excitation field $H_{DRIVE}$ varying with time as a triangle wave), then the amount of time spent in the high-resistance state $R_H$ will equal the amount of time spent in the low-resistance state $R_L$ (see FIG. 7B, with the sensed resistance $R_S$ varying with time as a square wave—due to the field $H_S$ passing above and below $H_{TR}$—). In other embodiments, wave forms other than triangle waves are used to enhance the sensitivity by maximizing the time spent near the transition. The DC voltage 244 is used to position the driving field $H_{DRIVE}$ to be symmetric around the natural transition field $H_{TR}$ when $H_{AP}$=0. If however, as shown in FIG. 6C, the sensed magnetic field, $H_S$, is driven to be a triangle wave with a DC shift relative to $H_{TR}$ (see FIG. 7C, with the sensed magnetic field $H_S$ varying with time due to the excitation field $H_{DRIVE}$ varying with time as a triangle wave and shifted down by $H_{AP}$), then the amount of time spent in the high-resistance state $R_H$ will be less than the amount of time spent in the low-resistance state $R_L$ (see FIG. 7D). Correspondingly, as shown in FIG. 6D, if the sensed magnetic field, $H_S$, is driven to be a triangle wave with a DC shift in the opposite direction as that shown in FIG. 6C relative to $H_{TR}$, (see FIG. 7E), then the amount of time spent in the high-resistance state $R_H$ will be more than the amount of time spent in the low-resistance state $R_L$ (see FIG. 7F).

Figure 6D:
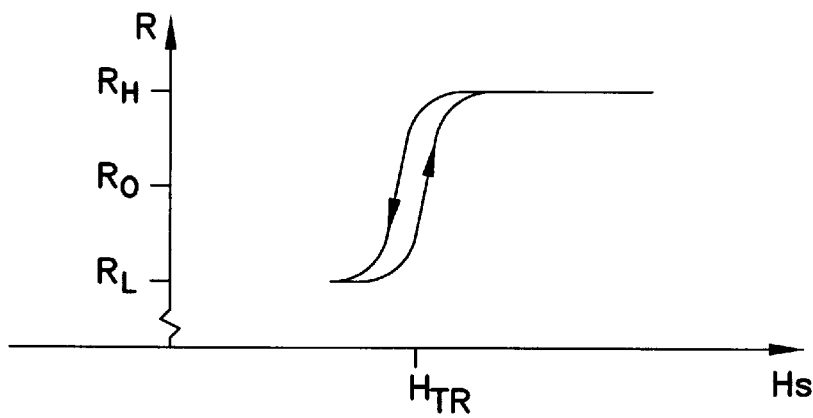
FIG. 6D shows another typical actual curve of resistance R versus magnetic field $H_S$, with a different DC shift in $H_S$.
Figure 7E:
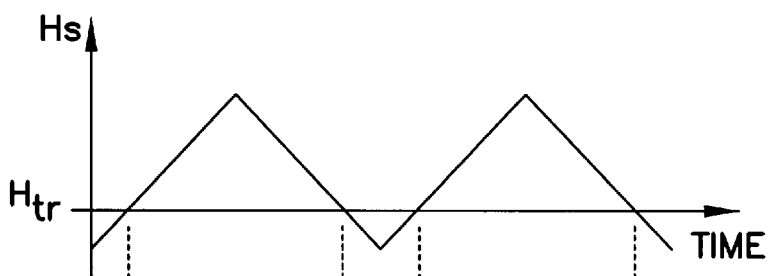
FIG. 7E shows a graph of the sensed magnetic field $H_S$ varying with time due to the excitation field $H_{DRIVE}$ varying with time as a triangle wave, and with a different DC shift in $H_S$.

It should be noted that the value of transition field $H_{TR}$ of FIGS. 6A through 6D stays at approximately the same value, and that the oscillating magnetic field ($H_{DRIVE}$) is offset by a DC bias to go further into saturation to the left in FIG. 6C and further into saturation to the right in FIG. 6D, relative to FIG. 6B.

It should be also noted that the shapes of the transfer functions of actual MR elements will vary according to details in the layer structure and preparation. For example, uniaxial anisotropies can be engineered in the pinned magnetic layers and the soft magnetic layers which may make the transition sharper or more repeatable to enhance sensor performance.

Figure 7F:
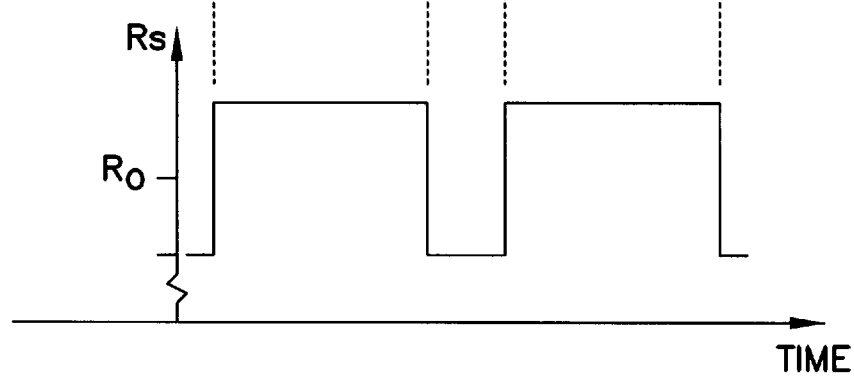
FIG. 7F shows a graph of the sensed resistance $R_S$ varying with time as a square wave—due to the field $H_S$ passing above and below $H_{TR}$, corresponding to FIG. 7E.
Figure 7G:
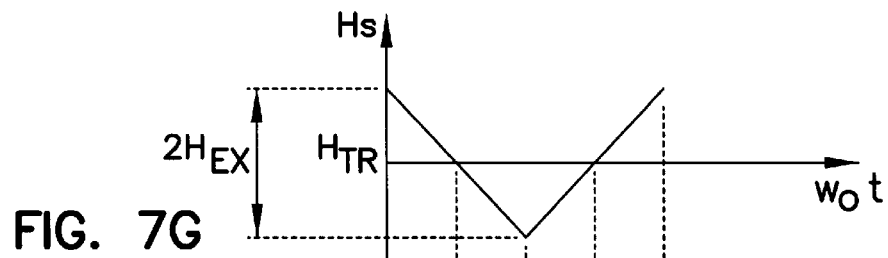
FIG. 7G shows a detailed graph for an asymmetric-resistance magnetoresistance device of the sensed magnetic field $H_S$ varying with time due to the excitation field $H_{DRIVE}$ at the sensing element varying with time as a triangle wave.
Figure 7H:
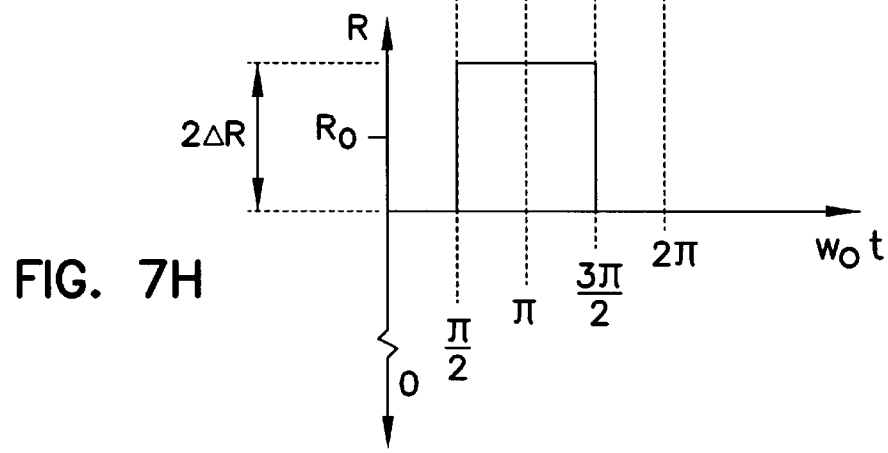
FIG. 7H shows a detailed graph of the sensed resistance $R_S$ varying with time as a square wave—due to the field $H_S$ passing above and below $H_{TR}$, corresponding to FIG. 7G.

FIG. 7G shows a detailed graph for an asymmetric-resistance magnetoresistance device of the sensed magnetic field $H_S$ varying with time due to the excitation field $H_{DRIVE}$ at the sensing element varying with time as a triangle wave. FIG. 7H shows a detailed graph of the sensed resistance $R_S$ varying with time as a square wave—due to the field $H_S$ passing above and below $H_{TR}$, corresponding to FIG. 7G.

Figure 7I:
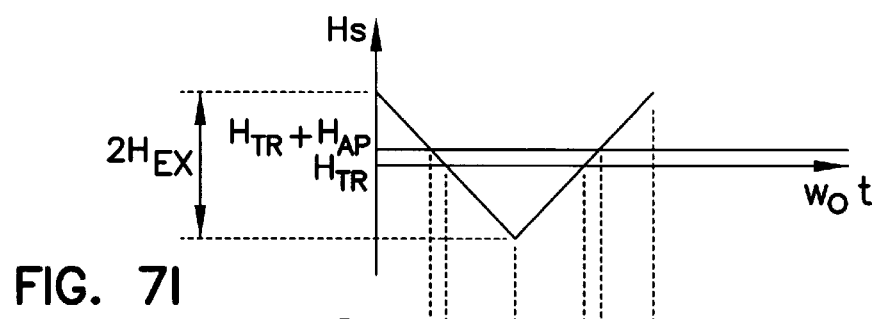
FIG. 7I shows a detailed graph for an asymmetric-resistance magnetoresistance device of the sensed magnetic field $H_S$ varying with time due to the excitation field $H_{DRIVE}$ varying with time as a triangle wave, and with a DC shift in $H_S$.
Figure 7J:
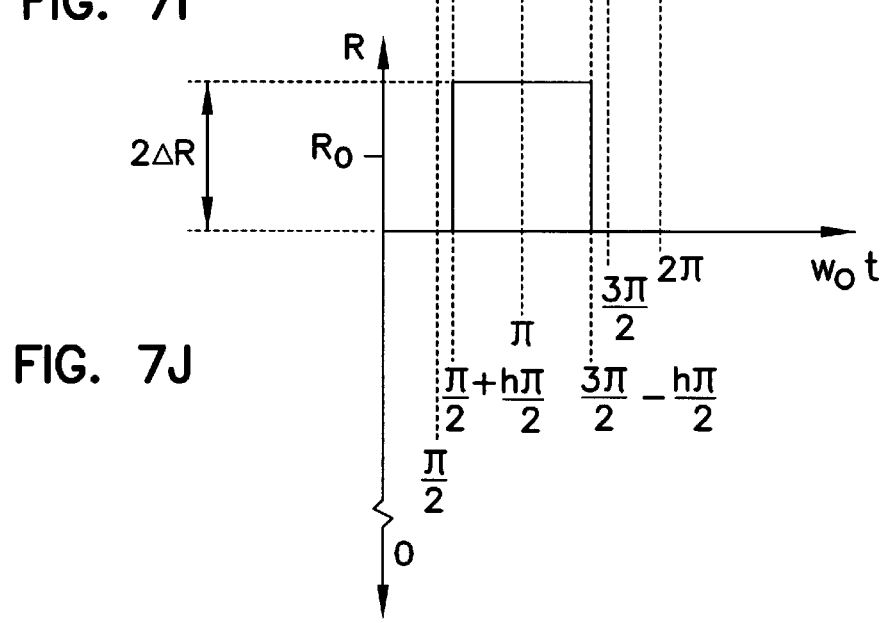
FIG. 7J shows a detailed graph of the sensed resistance $R_S$ varying with time as a square wave—due to the field $H_S$ passing above and below $H_{TR}$, corresponding to FIG. 7I.

FIG. 7I shows a detailed graph for an asymmetric-resistance magnetoresistance device of the sensed magnetic field $H_S$ varying with time due to the excitation field $H_{DRIVE}$ varying with time as a triangle wave, and with a DC shift in $H_S$. FIG. 7J shows a detailed graph of the sensed resistance $R_S$ varying with time as a square wave—due to the field $H_S$ passing above and below $H_{TR}$, corresponding to FIG. 7I.

Figure 7K:
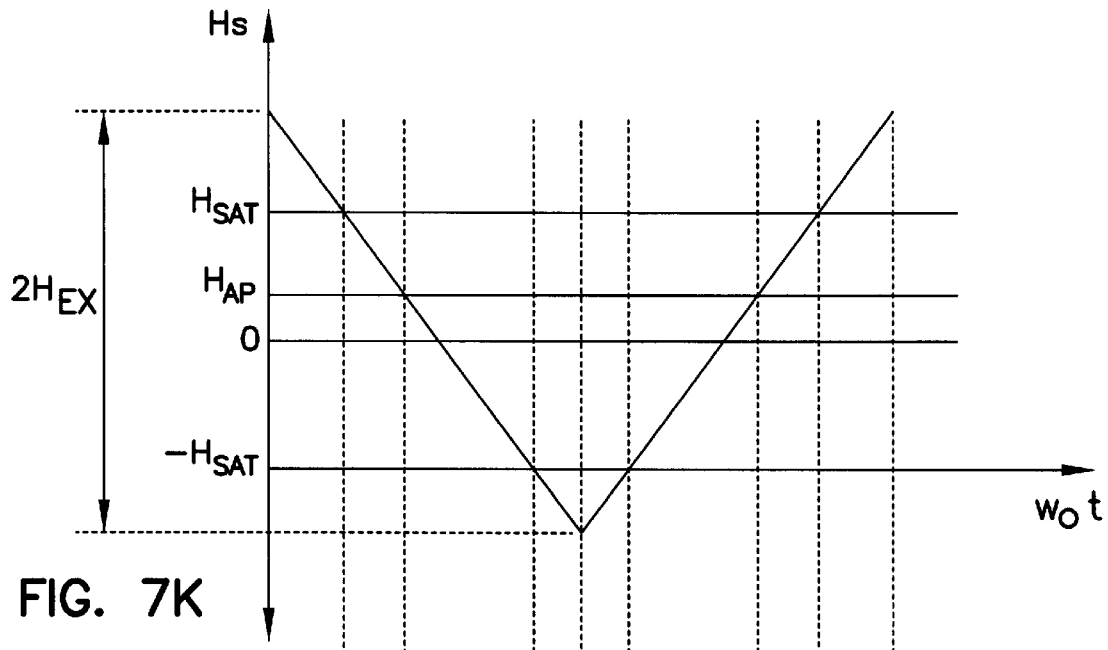
FIG. 7K shows a detailed graph for a symmetric-resistance magnetoresistance device of the sensed magnetic field $H_S$ varying with time due to the excitation field $H_{DRIVE}$ varying with time as a triangle wave, and with a DC shift in $H_S$.
Figure 7L:
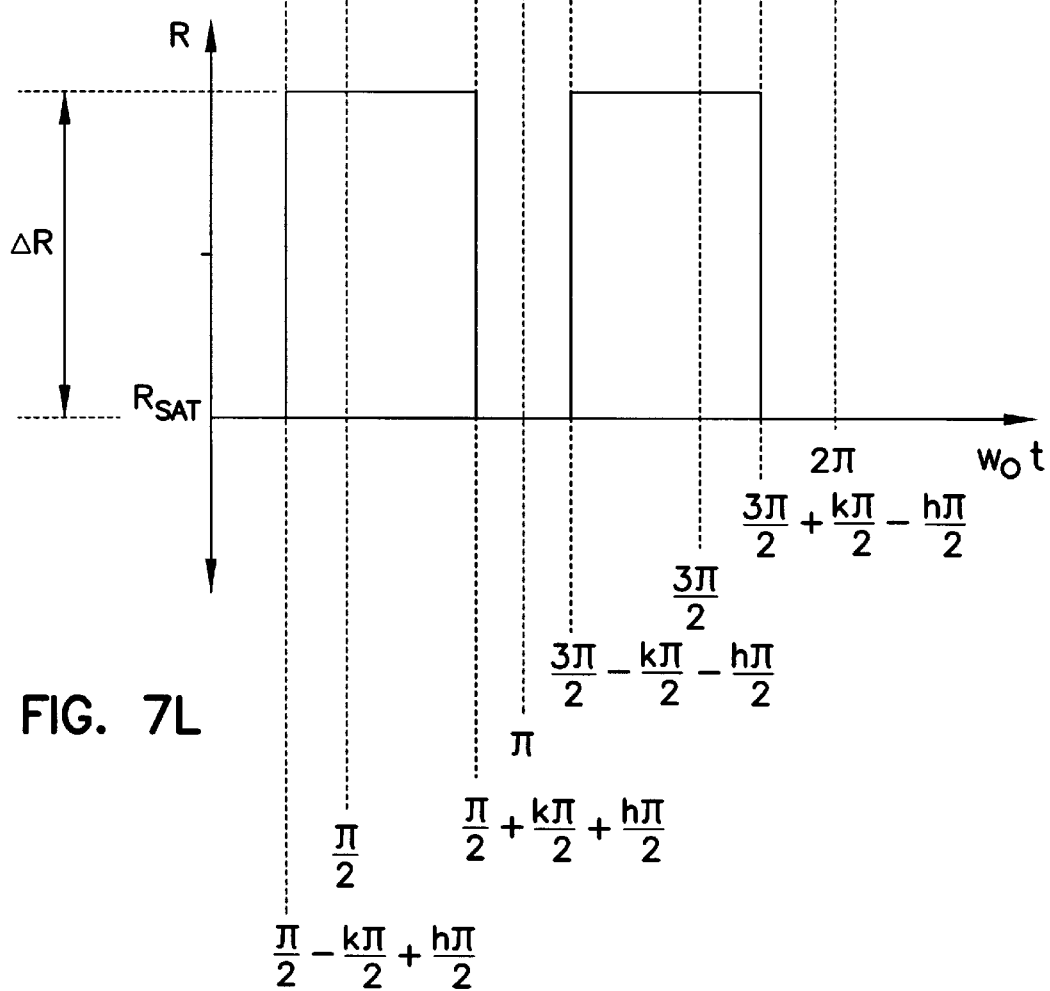
FIG. 7L shows a detailed graph of the sensed resistance $R_S$ varying with time as a square wave—due to the field $H_S$ passing above $H_{SAT}$ and below $H_{SAT}$, corresponding to FIG. 7K.

FIG. 7K shows a detailed graph for a symmetric-resistance magnetoresistance device of the sensed magnetic field $H_S$ varying with time due to the excitation field $H_{DRIVE}$ varying with time as a triangle wave, and with a DC shift in $H_S$. FIG. 7L shows a detailed graph of the sensed resistance $R_S$ varying with time as a square wave—due to the field $H_S$ passing above $H_{SAT}$ and below $-H_{SAT}$, corresponding to FIG. 7K.

Figure 8D:
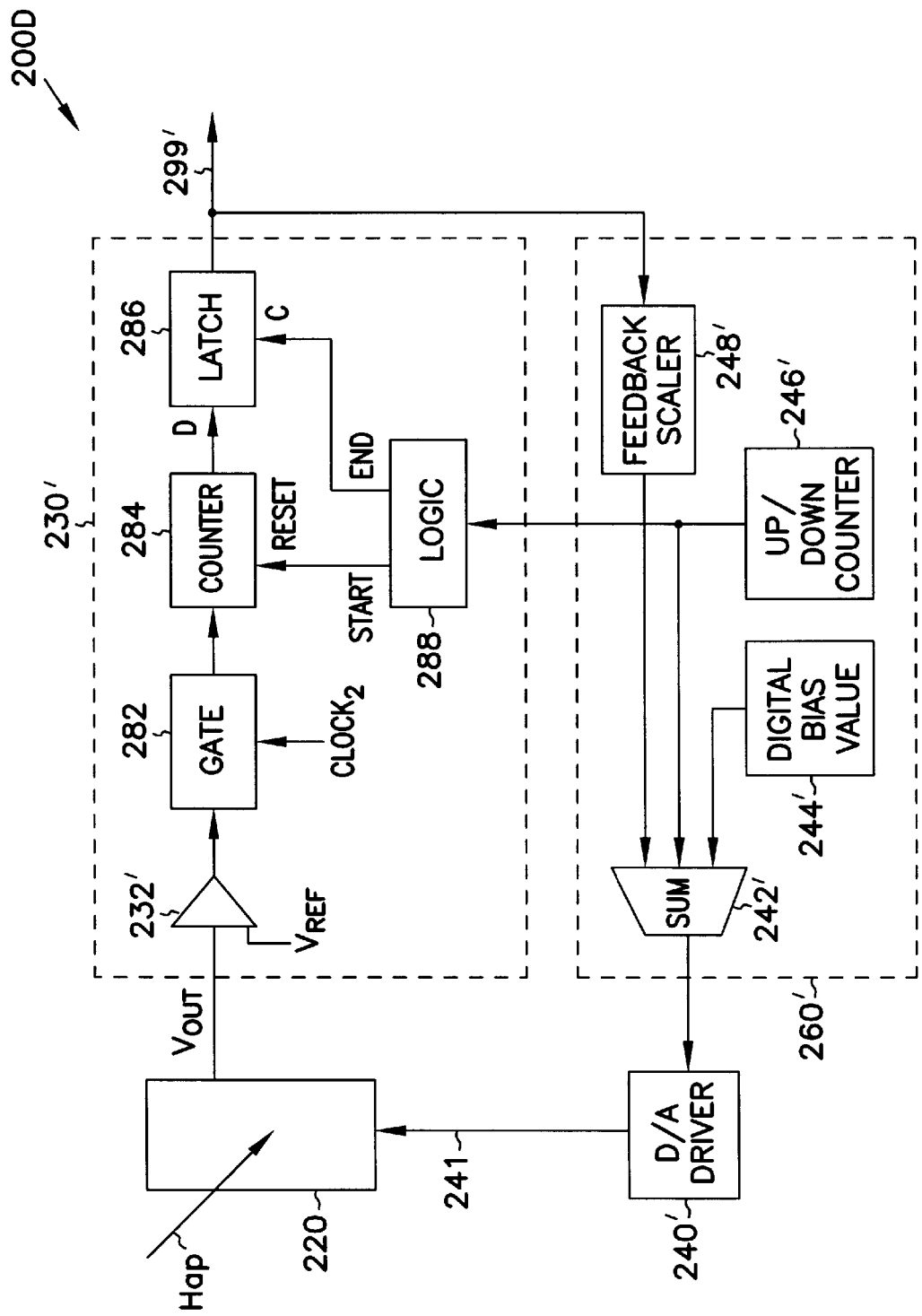
FIG. 8D shows a block diagram of one SEMR sensor 200C according to yet another embodiment of the present invention, using digital detection.
Figure 9A:
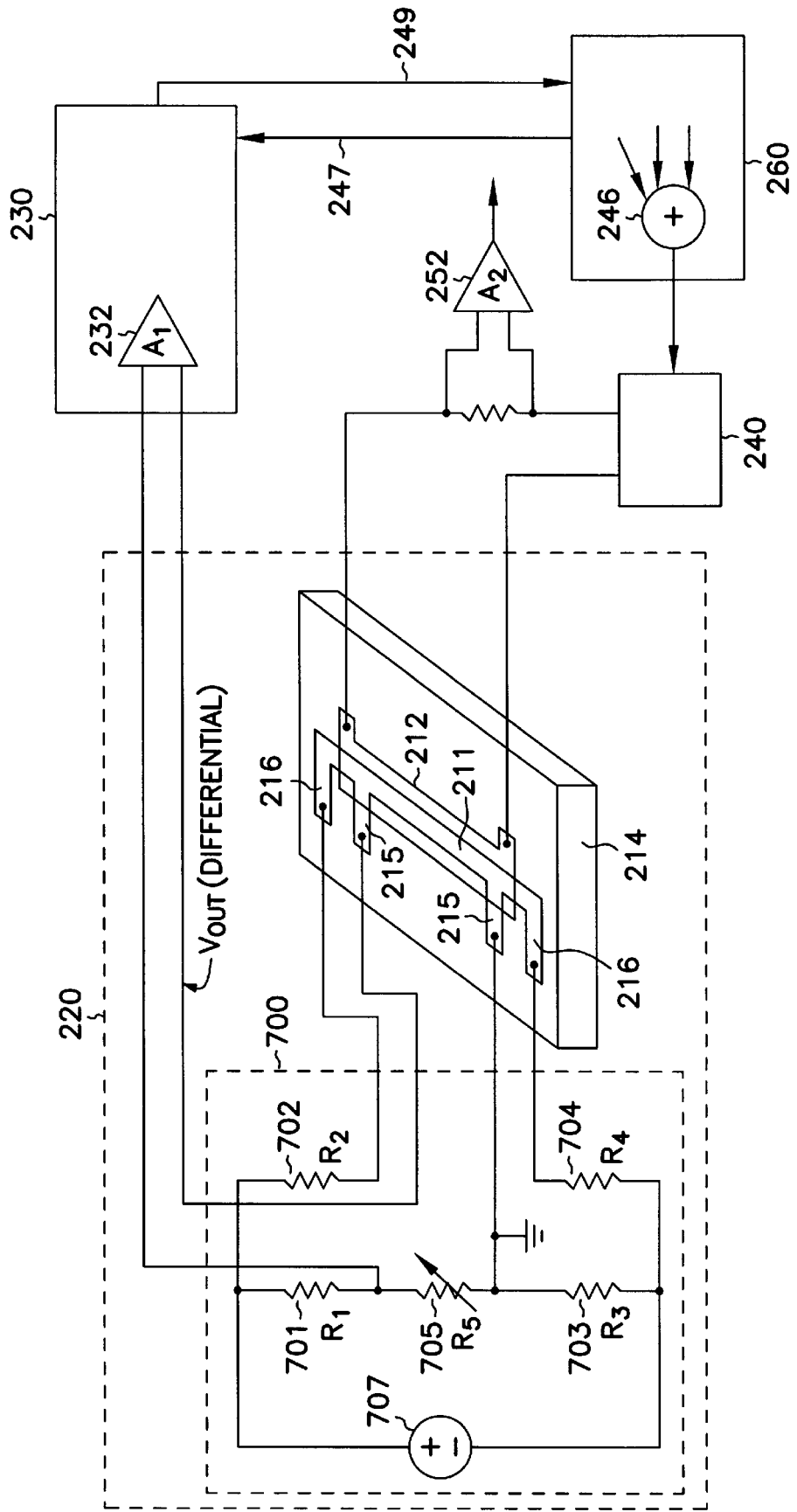
FIG. 9A shows circuit detail for one embodiment of MR sensor 220.

FIG. 8A shows a block diagram of one typical SEMR sensor 200A according to one embodiment of the present invention. MR sensor element 220 generates a signal $V_{OUT}$ which is similar to that shown in FIGS. 7B, 7D, and 7F. In addition, MR sensor element 220 is driven by an excitation signal 241, which generates excitation magnetic field $H_{DRIVE}$. Signal $V_{OUT}$ T is amplified by amplifier 232, and then drives two-omega mixer 236. In one embodiment, signal $V_{OUT}$ is a single-ended signal that is compared using amplifier 232 to some reference signal $V_{REF}$ such as shown in FIG. 8D. In other embodiments, signal $V_{OUT}$ T is a differential signal, and amplifier 232 is a differential amplifier, such as are shown in FIG. 9A. Two-omega mixer 236 is also driven by a signal from signal generator 246 as shifted by phase shifter 234. Here the term two-omega mixer means that the electronic circuit produces an output voltage proportional to the multiplication of the sensing element input voltage and a cosine wave voltage with twice the frequency of the excitation wave. In one embodiment, phase shifter 234 is omitted. In the embodiment shown in FIG. 8A, phase shifter 234 helps to reduce undesirable effects from hysteresis in MR sensor element 220. In one embodiment, signal generator 246 produces a triangle-wave voltage signal which is added by summer circuit 242 to a DC voltage generated by DC source 244, and then passed to power supply 240. In one embodiment, a KEPCO bipolar power supply model BOP 36-6 is used for power supply 240. In one embodiment, an EG&G PARC model 124 lockin amplifier is used for lockin amplifier 230 (to replace and perform the function of, amplifier 232, mixer 236, phase shifter 234, and LPF 238). The output signal from two-omega mixer 236 is then processed by low-pass filter 238 which removes substantially all the alternating-current (AC) components (for example, those components above 10 hertz), and passes a "pseudo-" direct-current (DC) component to output signal 299. The pseudo-DC output signal 299 is called pseudo-DC because it will change in proportion to the measured magnetic field $H_{AP}$. For example, in a compass system 100 to be used in a vehicle whose direction changes rapidly, such as a helicopter, it may be desirable to pass a rate of change to the pseudo-DC output signal 299 which accurately reflects the orientation of compass system 100 as it moves or rotates. In one embodiment, a plurality of the components of SEMR sensor 200A are integrated onto a single integrated circuit or integrated circuit module.

FIG. 8B shows a block diagram of another typical SEMR sensor 200B that includes a feedback loop 249 from the output of LPF 238 through amplifier 248 and into adder circuit 242, according to the present invention. All other components of SEMR sensor 200B are substantially identical to the corresponding components of SEMR sensor 200A. Feedback loop 249 takes a pseudo-DC signal proportional to the output of LPF 238 (and thus proportional to the environmental field $H_{AP}$ ) and in turn generates a counteracting field component HO added to the excitation field that counteracts the environmental field $H_{AP}$. Some of the purposes of counteracting the environmental field HA include keeping the SEMR sensor 200 in an optimal sensing operating region (in terms of sensitivity and linearity), to compensate for variations in circuit gain, and to compensate for temperature-related sensitivities of MR sensor element 220 and other circuit components. In one embodiment, a plurality of the components of SEMR sensor 200B are integrated onto a single integrated circuit or integrated circuit module.

FIG. 8C shows a block diagram of yet another SEMR sensor 200C that derives pseudo-DC output signal 299 from a voltage drop across resistor $R_{OUT}$ 251 as amplified by amplifier 258 and filtered by low-pass filter 258. All other components of SEMR sensor 200C are substantially identical to the corresponding components of SEMR sensor 200B. By deriving pseudo-DC output signal 299 from excitation signal 241 rather than from the output of LPF 238, certain undesirable gain-dependent or temperature features are reduced or eliminated, thus providing a more stable and accurate pseudo-DC output signal 299. In another embodiment, the resistance of the magnetic-field-producing means (excitation strip 212) is used instead of an additional resistor 251. In one embodiment, a plurality of the components of SEMR sensor 200C are integrated onto a single integrated circuit or integrated circuit module.

FIG. 8D shows a block diagram of one typical SEMR sensor 200D according to another embodiment of the present invention. In the embodiment, a digital-based detection scheme replaces all or part of the analog-based scheme of FIG. 8A, 8B, or 8C. MR sensor element 220 generates a signal $V_{OUT}$ which is similar to the $V_{OUT}$ shown in FIGS. 7B, 7D, or 7F. In the embodiment shown, $V_{OUT}$ is compared (by comparator 232') to $V_{REF}$, a reference voltage preset to give an indication of whether or not the measured resistance in a saturated region, e.g., $R_H$ of FIG. 6B or 7B. In other embodiments, signal $V_{OUT}$ is a differential signal such as shown in FIG. 9A, and amplifier 232' is a differential amplifier. In one embodiment, the output of comparator 232' is high (e.g., a digital ONE) when the resistance is at $R_H$ (see FIGS. 7B, 7D, and 7F), and low (e.g., a digital ZERO) when the resistance is at $R_L$ (see FIGS. 7B, 7D, and 7F). Gate 282 (e.g., an AND gate in one embodiment) passes pulses from $CLOCK_2$ only when the output of comparator 232' is high, and counter 284 accumulates a total number of these pulses. At the start of a measurement cycle, logic block 288 resets counter 284 to zeros; at the end of the measurement cycle, logic block 288 causes the final count to be latched in latch 286 which drives digital output signal 299'. In one embodiment, digital output signal 299' is processed by a digital microprocessor which uses a lookup table to convert the value at digital output signal 299' into a value that better represents the actual measured field, thus compensating for such errors as sensor non-linearity, etc. In the embodiment shown, up-down counter 246' provides a digital value that increments and then decrements corresponding to the triangle wave shown in, e.g., FIG. 7A, providing a digital function corresponding to signal generator 246 of FIG. 8B. In the embodiment shown, digital bias value generator 244' provides a digital value used to increment or decrement the value provided by counter 246', thus providing a digital function corresponding to bias generator 244 of FIG. 8B. In the embodiment shown, feedback scaler 248' provides a digital feedback value that is scaled (multiplied by a constant) from output signal 299' that is also used to increment or decrement, providing a digital function corresponding to amplifier 248 of FIG. 8B. Adder 242' provides a digital sum of the outputs of up-down counter 246', digital bias value generator 244', feedback scaler 248', thus providing a digital function corresponding to analog adder 242 of FIG. 8B. The output of adder 242' if converted from a digital value to an analog signal by D/A converter and driver 240', thus generating excitation driving signal 241. In one embodiment, several (e.g., ten cycles) of the triangle wave 241 are included between the start and end cycle defined by logic 288, thus providing a multiple-triangle-wave-cycle average to microcomputer 110 (see FIG. 1). The output signal 299' provides a count of $CLOCK_2$ pulses that is proportional to the amount of time spent at or above a particular resistance value (or conversely at or below a resistance value). In one embodiment, this time proportion is used to drive a look-up table (derived from calibration measurements) that generates a value representative of field strength. In other embodiments, separate detectors 230' are provided, one to count a time proportion in one saturated state, another to count the time in the other saturated state.

In one embodiment otherwise identical to that shown in FIG. 8D, feedback scaler 248' and its feedback path are omitted, thus providing a digital-based function corresponding to the circuit of FIG. 8A.

In one embodiment, in order to produce a signal proportional to the environmental field, SEMR 200 is excited with:

$$H_{DRIVE} = H_{BIAS} + H_{EX}TRI(\omega t),$$

then $$R = R_0 + \Delta R \; SGN(H_{AP} + H_{BIAS} + H_{EX}TRI(\omega t) - H_{TR}) = R_0 + \Delta R \; SGN(TRI(\omega t) + h),$$

where:

$R_0$=midpoint resistance $\Delta R$ =one half of the GMR resistance change $H_S$=magnetic field experienced by the sensing element$_{AP}$+$H_{DRIVE}$ $H_{TR}$=magnetic field at the center of the transition of the MR material SGN(H)=sign function which equals 1 if H>0 and −1 if H<0

$H_{DRIVE}$=drive magnetic field produced by magnet coil (or excitation strip 212)

$H_{EX}TRI(\omega t)$=oscillating component of the excitation magnetic field used to drive the sensor to saturation every cycle (in one embodiment, a triangle wave as shown in FIG. 7G oscillating about $H_{BIAS}$), where TRI($\omega t$)=triangle wave signal in phase with cos($\omega t$), with range (−1,1)

$H_{BIAS}$=drive DC component of the excitation magnetic field designed to be close to $H_{TR}$ $H_{AP}$=external environmental magnetic field to be measured h=a dimensionless magnetic field value representing reduced derivation between sensor field and transition field=$(H_S(DC)-H)/H_{Ex}$ and the idealized response function of FIG. 6A has been assumed as valid.

(Note that in another embodiment, a sinusoidal waveform replaces TRI(ωt), although the mathematics becomes more complicated.)

In one embodiment, this DC portion is measured (the "DC TECHNIQUE"):

$$R(DC) = R_0 + \Delta R \int_0^{2\pi} d(\omega t) \text{SGN}(TRI(\omega t) + h)$$

which equals $$R(DC) = R_0 + (\Delta R/2\pi) ((1)((\pi/2+h\pi/2)-(-\pi/2-h\pi/2))+(-1)((3\pi/2-h\pi/2)-(\pi/2+\pi/2)))$$

where the $(1)((\pi/2+h\pi/2)-(-\pi/2-h\pi/2))$ term represents the high-state resistance value and its multiplicand represents the time in the high state, and the $(-1)(3\pi/2-h\pi/2)-(\pi/2+h\pi/2))$ term represents the low-state resistance value and its multiplicand represents the time in the low state. This holds as long as $-1<h<1$. For $|h|>1$, R(DC) saturates at $R_0 \pm \Delta R$.

$$R(DC) = R_0 + \Delta R \, h$$

$$V_{OUT}(DC) = I_S \Delta R (H_{AP} + H_{BIAS} - H_{TR})/H_{EX} + I \, R_0 \quad \text{Equation 1}$$

where $I_S$ represents the current through the sensing element (MR strip 211).

The desired signal $V_{OUT}$ is therefore proportional to $H_{AP}$, which can be easily measured using Equation 1. However, drift in $R_0$ or $\Delta R$ will drastically affect the DC measured $H_{AP}$, limiting the sensitivity.

In other embodiments, such as are shown in FIGS. 8A, 8B or 8C, the even multiples of the excitation frequency are measured instead of the DC component. This reduces the sensitivity to drift in the magnitude of $R_0$. The two-omega mixer 236 (see, e.g., FIGS. 8A, 8B or 8C) is used to extract a two-omega signal proportional to the external environmental magnetic field $H_{AP}$ which is the external applied magnetic field to be measured.

Calculation for 2ω Technique $$R(\cos(2\omega t)) = (\Delta R/2\pi) \int_0^{2\pi} d(\omega t) \text{SGN}(TRI(\omega t) + h) \cos(2\omega t)$$

$$R(\cos(2\omega t)) = (\Delta R/2\pi) \left( \int_{-\pi/2-h\pi/2}^{\pi/2+h\pi/2} d(\omega t)(+1)\cos(2\omega t) + \int_{\pi/2+h\pi/2}^{3\pi/2-h\pi/2} d(\omega t)(-1)\cos(2\omega t) \right)$$

$$R(\cos(2\omega t)) = (\Delta R/4\pi)(\{\sin(2\omega t)\}_{-\pi/2-h\pi/2}^{\pi/2+h\pi/2} - \{\sin(2\omega t)\}_{\pi/2+h\pi/2}^{3\pi/2-h\pi/2})$$

Calculation for 2ω Signal $$R(\cos(2\omega t)) = (\Delta R/2\pi) \int_0^{2\pi} d(\omega t) \text{SGN}(TRI(\omega t) + h) \cos(2\omega t) \quad \text{Equation 2}$$

$$R(\cos(2\omega t)) = -(\Delta R/\pi)\sin(h\pi) \quad \text{for } h < 1$$

$$R(\cos(2\omega t)) \sim -\Delta R h \quad \text{for } h \ll 1$$

$$V_{OUT(2\omega)} \sim -I\Delta R(H_{AP} + H_{BIAS} - H_{TR})/H_{EX}$$

Notice that the $H_{AP}$ result is now independent of $R_O$ reducing the temperature dependence of the result considerably. However, the result will still vary if R is varying (because of temperature fluctuations), $H_{BIAS}$ or $H_{EX}$ is varying (due to an imperfect drive oscillator, power supply, or magnet coils). Another problem is the limited range of linearity.

These limitations can be partly overcome by using feedback such as in FIGS. 8A, 8B, and 8C to keep the R(cos(2 t)) component as close to zero as possible. In these cases, a voltage proportional to the environmental field can be measured across a resistor in parallel with the field-producing means. Since the feedback mechanism will keep the field at the sample nearly proportional to the opposite of the environmental field, the average current flowing through the field-producing means will contain a signal proportional to the environmental field $H_{AP}$. This average current can be measured by measuring the voltage drop across the field-producing means or by measuring the voltage drop across another resistor in series with it 251.

The possibility exists of hysteresis in the resistance versus field behavior of the sensing element (unlike FIG. 6A, but instead like FIG. 6B). This will cause a phase delay Φ in the R value relative to the H value, shifting the transition points for the integration.

$$R(\cos(2\omega t)) = (\Delta R/4\pi)(\{\sin(2\omega t)\}_{-\pi/2-h\pi/2+\Phi}^{\pi/2+h\pi/2+\Phi} - \{\sin(2\omega t)\}_{\pi/2+h\pi/2+\Phi}^{3\pi/2-h\pi/2+\Phi})$$

$$R(\cos(2\omega t)) = (\Delta R/4\pi)(\sin(\pi + h\pi + 2\Phi) -$$

$$\sin(-\pi - h\pi + 2\Phi) - \sin(3\pi - h\pi + 2\Phi) + \sin(\pi + h\pi + 2\Phi))$$

$$R(\cos(2\omega t)) = (\Delta R/4\pi)(2\sin(\pi + h\pi + 2\Phi) - 2\sin(-\pi - h\pi 2\Phi))$$

$$R(\cos(2\omega t)) = (\Delta R/2\pi)(\sin(\pi + h\pi + 2\Phi) + \sin(\pi + h\pi - 2\, \Phi))$$

$$R(\cos(2\omega t)) = (\Delta R/\pi) \sin(h\pi) \cos(2\Phi) \quad \text{as long as } h < 1$$

$$R(\cos(2\omega t)) = (\Delta R \, h \cos(2\Phi)) \quad \text{for } h \ll 1$$

As long as (Φ<30 degrees), the signal will only degrade by less than half. The (Φ value can be kept small by adjusting the phase shift of phase shifter 234. The optimum phase will give the maximum signal for a h<>0 state.

FIG. 9A shows circuit detail for one embodiment of SEMR sensor 220 including a MR sensor element 210 such as is shown in FIG. 2A. In this embodiment, MR strip 211 is driven with a Wheatstone-bridge-type circuit, designed to provide a relatively constant current through terminals 216. Electric source 707 (in one embodiment, electric source 707 is a constant-current source) is coupled through resistor R2 702 to one terminal 216 of MR strip 211 and on to R4 704 which is coupled to the other node of electric source 707, thus forming two legs of the Wheatstone bridge. In one embodiment, electric source 707 provides a DC signal. In another embodiment, it provides an AC excitation signal, which would necessitate an additional lockin amplifier detection system whose output would then be the input to the main lockin amplifier 230. The other pair of legs of the Wheatstone bridge is formed by resistor R1 701, and by series resistors R5 705 and R3 703. The node between R5 705 and R3 703 is connected to ground and to one of the voltage-sensing terminals 215 of MR strip 211. The node between R1 701 and R5 705 is connected to one input of differential amplifier 232, and the other input of differential amplifier 232 is connected to node between the other voltage-sensing terminal 215 of MR strip 211 and R5 705 and R3 703. In one embodiment, R1 701, R2 702, R3 703, and R4 704 are selected to be equal, and in one embodiment are selected to by 500 ohms. In this embodiment, R5 is selected to be equal to the $R_0$ resistance of MR strip 211. In another embodiment, a resistance bridge with more than one leg consisting of a SEMR sensing element is used.

Figure 9B:
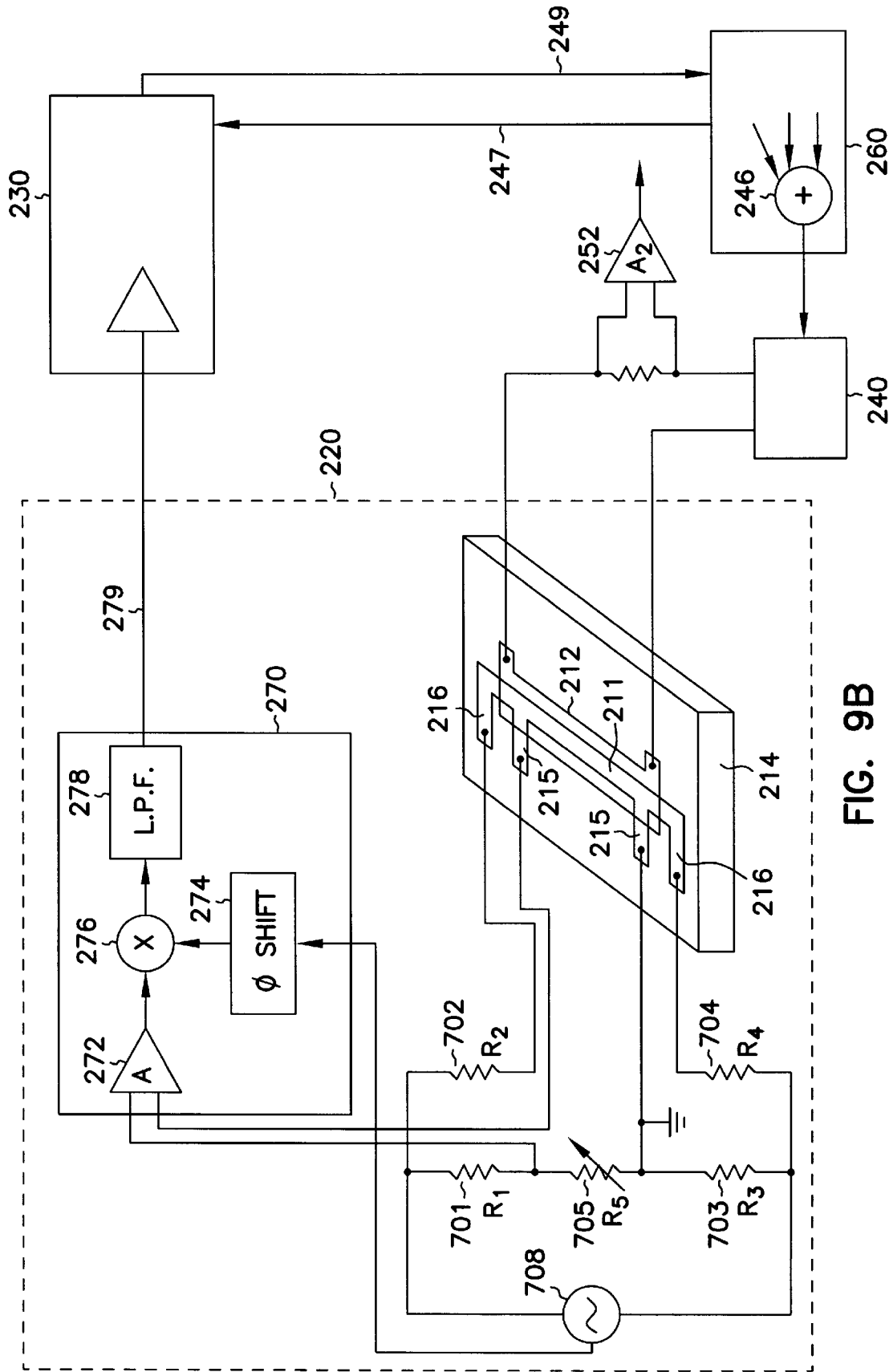
FIG. 9B shows circuit detail for another embodiment of MR sensor 220.

FIG. 9B shows circuit detail for another embodiment of a SEMR sensor 220 where an AC sine wave signal 707 is used to drive the sensing current. Here a second lockin amplifier is used to determine the voltage component in phase with the sensing current excitation frequency, which is typically much higher than the drive field excitation frequency. The output of this lockin amplifier will then be proportional to the resistance of the MR strip 211. This output is then used as input for the lockin amplifier 230 to be used in the same manner as for FIG. 9A.

The above descriptions for FIGS. 6A–6F, 7A–7J, 8A–8D, and 9A–9B illustrate techniques for using asymmetric-resistance MR materials together with an AC excitation field to measure weak magnetic fields. FIGS. 1A–1C and the following discussion describe the analogous procedure for using symmetric-resistance MR materials to measure weak magnetic fields.

Figure 11A:
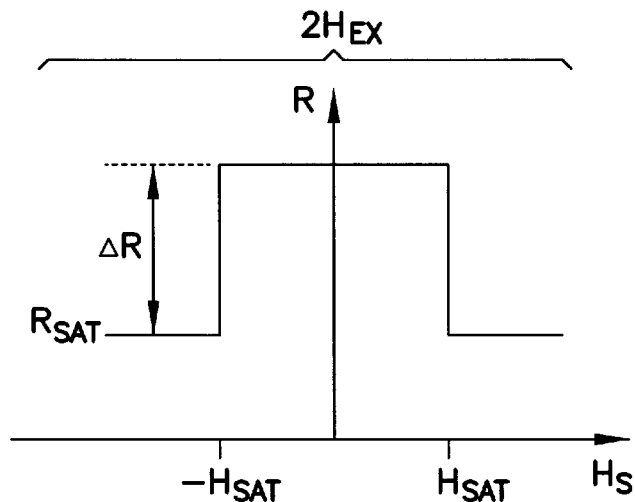
FIG. 11A shows an exemplary graph of the resistance versus $H_S$ for a symmetric SEMR sensor 200, wherein the excitation field is a triangle wave that goes from $+H_{EX}$ to $-H_{EX}$ with zero shift due to applied environmental magnetic fields.

FIG. 11A shows an idealized curve of resistance R versus magnetic field $H_S$ for a symmetric-resistance MR strip 211. As $H_S$ is varied from positive saturation to negative saturation and back, there is a resistance maximum at $H_S=0$ with a resistance change $\Delta R$ between the $H_S=0$ point and the saturation resistance $R_{SAT}$. In actual materials, the response curve will possess rounded transitions, may have a different sign, and may contain hysteresis. The following mathematical derivations will assume the idealized shape of the response curve, although generalizing the technique for actual materials is straightforward.

Figure 11B:
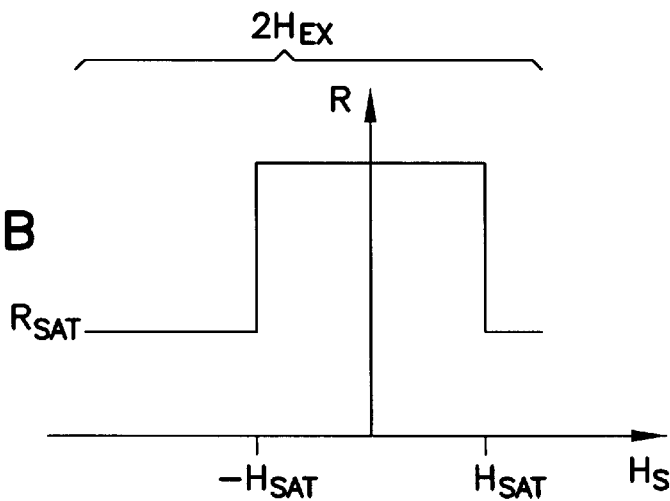
FIG. 11B shows another exemplary graph of the resistance versus $H_S$ for a symmetric SEMR sensor 200, wherein the excitation field is the same as in FIG. 11A, but is shifted in a negative direction by an applied environmental magnetic field.
Figure 11C:
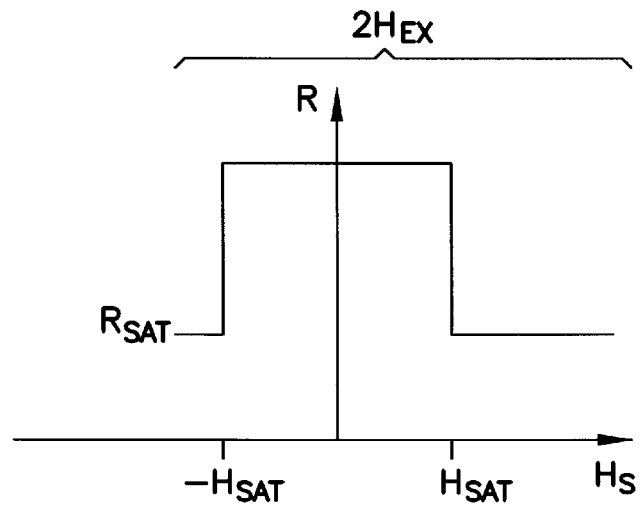
FIG. 11C shows another exemplary graph of the resistance versus $H_S$ for a symmetric SEMR sensor 200, wherein the excitation field is the same as in FIG. 11A, but is shifted in a positive direction by an applied environmental magnetic field.

FIG. 11A shows an exemplary graph of the resistance versus $H_S$ for a symmetric SEMR sensor 200, wherein the excitation field is a triangle wave that goes from $+H_{EX}$ to $-H_{EX}$ with zero shift (the $H_S$ excitation field is centered on $H_S=0$) due to zero applied environmental magnetic fields. With a triangle wave excitation field, the amount of time spent above $+H_{SAT}$ (in saturation in one direction) will equal the amount of time spent below $-H_{SAT}$ (in saturation in the antiparallel direction). FIG. 11B shows another exemplary graph of the resistance versus $H_S$ for a symmetric SEMR sensor 200, wherein the excitation field is the same as in FIG. 11A, but is shifted in a negative direction by an applied environmental magnetic field. With a triangle wave excitation field, the amount of time spent above $H_{SAT}$ (in saturation in one direction) will be less than the amount of time spent below $-H_{SAT}$ (in saturation in the antiparallel direction). FIG. 11C shows another exemplary graph of the resistance versus $H_S$ for a symmetric SEMR sensor 200, wherein the excitation field is the same as in FIG. 11A, but is shifted in a positive direction by an applied environmental magnetic field. With a triangle wave excitation field, the amount of time spent above $H_{SAT}$ (in saturation in one direction) will be more than the amount of time spent below $-H_{SAT}$ (in saturation in the antiparallel direction). In one embodiment, measuring the amount of time spent in one saturated state (e.g., by synchronizing the timing function to the phase of the triangle wave in order to time the proper saturation phase) provides information on he magnitude of the applied environmental field. In another embodiment, the measurement determines the relative amount of time in one saturated state versus the other saturated state (i.e., the time above $H_{SAT}$ versus the time below $-H_{SAT}$). In yet another embodiment, the measurement determines the relative amount of time in one saturated state versus the unsaturated state (i.e., the time above $H_{SAT}$ versus the time between $H_{SAT}$ and $-H_{SAT}$).

If, as shown in FIG. 11A, the sensed magnetic field, $H_S$ is driven to be a triangle wave centered on $H_S=0$ (see FIG. 7K, with the sensed magnetic field $H_S$ varying with time due to the excitation field $H_{DRIVE}$ varying with time as a triangle wave), then the resistance changes will occur with a specific phase relationship to the excitation wave. In the case of FIG. 11A, the resistance deviations will be evenly spaced. In the case of FIGS. 11B and 11C, the phase relationship between the resistance deviations and the excitation wave have changed. These variations in the resistance contain information on the value of the offset field. One means of converting this waveform into a voltage proportional to the environmental field is nearly the same for symmetric-resistance MR materials as for asymmetric-resistance MR materials, except that the odd frequency multiples of the excitation frequency are used instead of the even multiples.

For a symmetric-resistance material such as that shown in FIGS. 7K, 7L, and 1A–1C, $$R_S = R_{SAT} + \Delta R \, r((\omega t)$$

where $R_{SAT}$ is the resistance of the sensing element at saturation $R_{SAT} + \Delta R$ is the resistance of the sensing element in the unsaturated state r is a dimensionless function equaling 1 when the sensing element is in the unsaturated state and 0 when the sensing element is in the saturated state.

$$r(\cos(\omega t)) = \int d(\omega t) \cos(\omega t) r(\omega t)$$

$$r(\cos(\omega t)) = (1)[\sin(\omega t)]_{(\pi/2)(1-k+h)}^{(\pi/2)(1+k+h)} + (1)[\sin(\omega t)]_{(\pi/2)(3-k-h)}^{(\pi/2)(3+k-h)}$$

where $h = H_{AP}/H_{EX}$ $k = H_{SAT}/H_{EX}$ $r(\cos(\omega t)) = \sin((\pi/2)(1+k+h)) - \sin((\pi/2)(1-k+h)) + \sin((\pi/2)(3+k-h)) - \sin((\pi/2)(3-k-h))$ $r(\cos((\omega t)) - \cos((\pi/2)(1+h))\sin(k\pi/2) + 2\cos((\pi/2)(3-h))\sin(k\pi/2)$ $r(\cos(\omega t) = -4\sin(k\pi/2)\sin(h\pi/2)$ $r(\cos(\omega t)) \sim H_{AP}(-4(\pi/2)\sin(k\pi/2)/H_{EX})$ $V_{OUT} \sim H_{AP}(-4(\pi/2)\sin(k\pi/2)I_S^2 \Delta R/H_{EX})$ Therefore, by measuring the voltage signal proportional to the resistance at the same frequency and phase as the excitation field, a signal proportional to the environmental field is acquired. In other embodiments, other odd multiples of the excitation frequency are used to extract DC voltage signals proportional to the environmental field. Although the above calculations address detection at only the first and second multiples of the excitation frequency, calculations corresponding to other frequencies are similar and straightforward.

Figure 10:
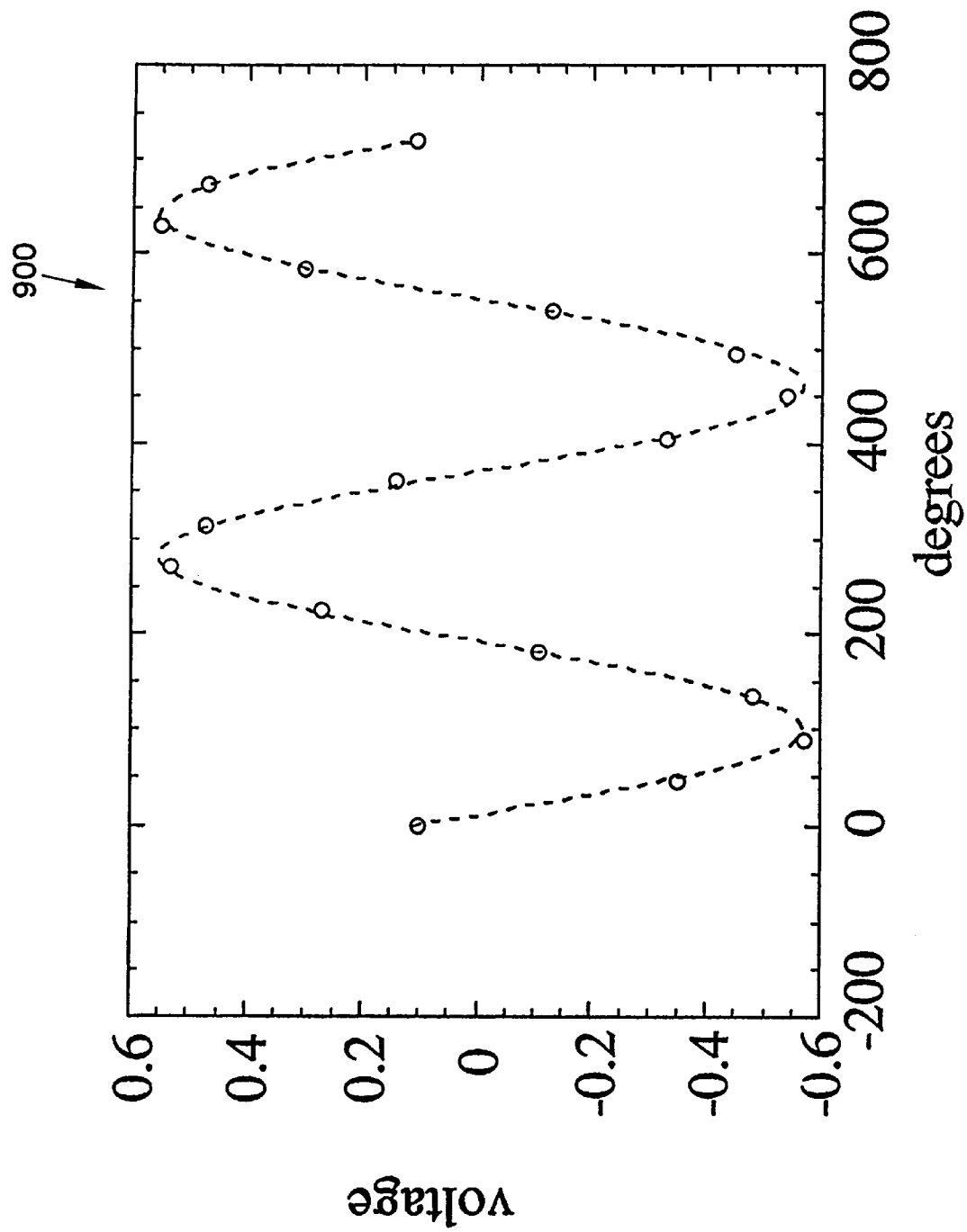
FIG. 10 shows an exemplary graph of the voltage versus orientation-in-a-geomagnetic-field for a SEMR sensor 200.

FIG. 10 shows an exemplary graph 900 of the voltage versus orientation in a geomagnetic field for a SEMR sensor 200 ( such as SEMR 200A of FIG. 8A) showing the application as a compass indicator. For this measurement, the circuit of FIG. 9B together with an asymmetric-resistance MR sensing element were used and the signal was extracted from the output of the 2ω lockin amplifier. The electric excitation frequency of the sensing element current was 30700 Hz and the frequency of the excitation magnetic field was 20 Hz. The excitation field is produced with an external coil (having 25 turns approximately 4 centimeters in diameter) rather than an integral current strip 212 as shown in FIG. 2A. The vertical scale is a voltage proportional to the change in resistance as the device is rotated relative to the earth's magnetic field. A low-pass filter was used to remove the excitation field frequency. The total noise including high frequency variations and drift is calculated to be less than 0.01 Oe.

One main feature of the present invention is the use of an oscillating excitation field together with a magnetoresistive sensing element that allows measurement of fields much smaller than the transition width $H_W$ of the magnetic material. The excitation field is large enough to saturate substantially the magnetization in the directions parallel and antiparallel to the excitation axis. Then an external DC field will produce an offset in the excitation field experienced at the sensor, as shown in FIGS. 6B, 6C, and 6D and FIGS. 11A, 11B, and 11C. A key advantage of these techniques is that the excitation field wipes out virtually all traces of the magnetic history of the device. For the asymmetric-resistance MR sensor, this changes the length of time the resistance is in the high state relative to the low state as shown in FIGS. 7B, 7D, and 7F, which will cause a change in the DC, $2\omega$, $4\omega$, etc. frequency components of the measured resistance. For the symmetric-resistance MR sensor, this changes the positions of the magnetic transitions relative to the excitation signal as shown in FIGS. 11A, 11B, and 11C which will cause a change in the $\omega$, $3\omega$, etc. frequency components of the measured resistance. In all cases, the environmental field component being sensed ($H_{AP}$) is parallel to the excitation field axis, although techniques where the sensed field component is not parallel to the excitation field axis are also possible.

A similar excitation technique has been used in flux-gate magnetometers, with significant differences in the sensing techniques. In flux-gate devices, a macroscopic core's transition is sensed by an inductive pickup coil. In the present invention, magnetoresistive detection combined with a significantly smaller 'core' produces a very different device with many advantages over flux-gate magnetometers. Size and power needs can be reduced because of the smaller device size. Cost can be reduced because integrated circuit fabrication techniques can produce magnetoresistive devices, with supporting electronics, very efficiently. There is an additional difference in the type of signal produced for the asymmetric-resistance MR devices from those produced by flux-gate devices. In flux-gate devices, the sensor produces the most useful AC signal during the transitional state. For the asymmetric-resistance MR devices, the key information is derived from the saturated state, and the details of the transition region are less significant.

There are also differences between the present invention and previous static techniques to measure weak magnetic fields using AMR materials. Several of these approaches (Kwiatkowski and Tumanski, 1986) control the angle between the current vector and the environmental field, but do not deliberately excite the magnetization vector during the measurement process. The magnetization vector is engineered to point in a direction such that the MR signal is very sensitive to environmental fields. These methods include using serpentine current paths, barber pole biasing, hard magnet biasing, or exchange biasing. Since all ferromagnetic materials are susceptible to hysteresis, signals from such devices will be susceptible to inaccuracies depending on the magnetic history of the devices. The present invention reduces such inaccuracies by using the oscillating excitation field to drive the ferromagnetic material to saturation during each cycle. This oscillating excitation field, preferably driving the MR measurement strip into saturation each cycle reduces or eliminates the need for barber-pole biasing and/or serpentine current paths in order to use AMR materials for measuring weak magnetic fields.

There are also differences between the present invention and known excitation techniques for AMR materials as described in (de Ridder and Fluitman, 1984), (Kwiatkowski and Tumanski, 1986), U.S. Pat. No. 5,255,442, (Kaplan and Paperno, 1994), (Paperno and Kaplan, 1995A and Paperno and Kaplan, 1995B), and U.S. Pat. No. 5,427,278 (Pant, Krahn and Fryer). In the first case, the excitation field is at a 45 degree angle to the current direction to produce a more complicated resistance versus excitation field transfer function, and the component of the environmental field being sensed is perpendicular to the excitation field (in contrast, since the present invention does not require a 45 degree angle between the current vector and the measurement vector, it thus reduces or eliminates the need for barber-pole biasing and/or serpentine current paths as used in other MR sensors). In the second case, a square wave excitation signal is used, the magnetization is not driven to saturation, and the sensed field component is perpendicular to the excitation field. In the third case, a square wave excitation signal is used, the magnetization is not driven to saturation, and the key measurements are actually a series of DC measurements rather than an AC measurement. In the fourth case, a complicated two frequency excitation signal is used, the magnetization is not driven to saturation, and the field information is obtained by measuring the signal at the frequency which is the difference between the two excitation frequencies. In the fifth case, two excitation field generators are required to produce an excitation field direction which rotates as opposed to remaining along an axis fixed to the sensing element, and there is no clear extrapolation of the technique where only a single excitation axis is sufficient. In the sixth case, a periodic series of positive and negative pulses is used in place of a triangle wave, the direction of sensitivity is perpendicular to the excitation field direction, and the key measurements are a series of DC measurements with the MR material in the unsaturated state.

It should be stressed that, despite the techniques described above, excitation of magnetoresistive elements to enhance the measurement process is not an obvious procedure. An article by Spong et al. discusses the production of GMR sensors which incorporate current strips to produce localized magnetic fields. These field producing strips are used during the post-deposition processing of the devices, and the authors take care to describe many possible applications of the field producing strips. Significantly, excitation fields to assist measurement of weak magnetic fields is not mentioned as an application of the current strips, supporting the view that such utilization constitutes a new invention.

The potential advantages of the technique of the present invention compared to flux-gate devices include size, power, and sensor complexity. The advantages compared to other MR schemes include greater sensitivity to weak magnetic fields and reduced problems related to the magnetic history of the sensor. Applications for this device include compasses, attitude sensors, and proximity sensors.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A magnetoresistive element comprising:
   a magnetoresistive (MR) sensing element comprising:
      a high-resistivity ferromagnetic layer having a first major surface; and a first low-resistivity ferromagnetic layer having a first major surface adjoining the first major surface of the high-resistivity ferromagnetic layer such that the two layers couple ferromagnetically at their interface, the first low-resistivity layer being thinner than the high-resistivity layer as measured along a straight line substantially perpendicular to the first major surface of the high-resistivity layer, wherein a change in magnetic field changes a resistivity of the (MR) sensing element.

2. The magnetoresistive element according to claim 1, wherein the high-resistivity ferromagnetic layer is a soft ferromagnetic material, and is between approximately 2 nanometers and 1000 nanometers thick; and the first low-resistivity ferromagnetic layer is between approximately 0.2 nanometers and 100 nanometers thick.

3. The magnetoresistive element according to claim 1, wherein the high-resistivity ferromagnetic layer comprises NiFeMo in a ratio of approximately 80% Ni, 16% Fe, and 4% Mo, and is approximately 1200 angstroms thick; and the first low-resistivity ferromagnetic layer comprises cobalt or a cobalt alloy, and is approximately 20 angstroms thick.

4. The magnetoresistive element according to claim 1, further comprising:

a spacer layer adjoining the first low-resistivity ferromagnetic layer; and a hard layer ferromagnetic structure, adjoining the spacer layer opposite the low-resistivity ferromagnetic layer, having a hard magnetization.

5. The magnetoresistive element according to claim 1, further comprising:

a spacer layer adjoining the first low-resistivity ferromagnetic layer; and a second ferromagnetic layer adjoining the spacer layer opposite the low-resistivity ferromagnetic layer; and a pinning layer adjoining the second ferromagnetic layer.

6. The magnetoresistive element according to claim 5, wherein the high-resistivity ferromagnetic layer comprises NiFeMo in a ratio of approximately 80% Ni, 16% Fe, and 4% Mo, and is approximately 1200 angstroms thick;

the first low-resistivity ferromagnetic layer comprises cobalt or a cobalt alloy, and is approximately 20 angstroms thick;

the spacer layer comprises copper, and is approximately 35 angstroms thick;

the second ferromagnetic layer comprises cobalt or a cobalt alloy, and is approximately 30 angstroms thick; and the pinning layer comprises FeMn in a ratio of approximately 50% Fe and 50% Mn, and is approximately 85 angstroms thick.

7. The magnetoresistive element according to claim 1, further comprising:

an excitation structure magnetically coupled to the MR sensing element;

a first driving circuit coupled to the excitation structure that provides a drive signal to the excitation structure to create an excitation magnetic field that oscillates about a total bias value;

a second driving circuit that produces a current through the MR sensing element; and a sensing circuit that converts a sensed signal from the MR sensing element into an output signal representative of the external environmental magnetic field.

8. The magnetoresistive element according to claim 7, wherein the excitation structure comprises a conducting strip separated from the MR sensing element by an insulating layer.

9. The magnetoresistive element according to claim 7, wherein the output signal is coupled to the first driving circuit to provide a feedback component that varies the total bias value so as to keep the MR sensing element in a range chosen to achieve sensitivity and/or linearity.

10. The magnetoresistive element according to claim 7, wherein the drive signal oscillates as substantially a triangle wave about the total bias value.

11. The magnetoresistive element according to claim 7, wherein the MR sensing element exhibits a substantially symmetric resistance-versus-field transfer function and the sensing circuit measures a signal representative of one or more odd multiples of the driving frequency so as to produce an output signal representative of the external environmental magnetic field.

12. The magnetoresistive element according to claim 7, wherein the MR sensing element exhibits a substantially asymmetric resistance-versus-field transfer function and the sensing circuit measures a signal representative of one or more even multiples of the driving frequency, possibly including a DC component, so as to produce an output signal representative of the external environmental magnetic field.

13. The magnetoresistive element according to claim 7, wherein the sensing circuit measures a time proportion representative of a ratio of a time that the magnetic-field sensor is in one or more saturated states to a time that the magnetic-field sensor is in one or more unsaturated states, whereby an output signal representative of the external environmental magnetic field is produced.

14. The magnetoresistive element according to claim 7, wherein the sensing circuit measures a time proportion representative of a ratio of a time that the magnetic-field sensor is in a first saturated state to a time that the magnetic-field sensor is in a second saturated state, whereby an output signal representative of the external environmental magnetic field is produced.

15. The magnetoresistive element according to claim 7, further comprising:

an output indicator coupled to the sensing circuit that provides an output signal that includes an indication of a direction of a geomagnetic field.

16. In a magnetoresistive (MR) sensing element, a magnetoresistive structure comprising:

a first ferromagnetic layer having a fixed magnetization, and having an interface surface that is substantially planar;

a second ferromagnetic layer having an interface surface that is substantially planar and generally facing the interface surface of the first ferromagnetic layer;

a spacer layer of non-ferromagnetic material located between the interface surface of the first ferromagnetic layer and the interface surface of the second ferromagnetic layer and adjoining each;

wherein the second ferromagnetic layer includes a hard-magnetization-portion layer having a hard magnetization, and a soft-magnetization-portion layer located between the spacer layer and the hard portion layer and adjoining each.

17. The magnetoresistive structure according to claim 16, wherein
the first ferromagnetic layer comprises:
a first pinning layer;
a first thin ferromagnetic layer adjoining and located between the first pinning layer and the spacer layer and adjoining each, and that is pinned to hard magnetization in a first direction by the first pinning layer; and
the second ferromagnetic layer comprises:
a second pinning layer;
a second thick ferromagnetic layer located between the second pinning layer and the spacer layer, wherein the hard portion layer is part of the second thick layer, the soft portion layer is part of the second thick layer,
the hard portion layer, located between the second pinning layer and the soft portion layer, is located adjacent to the second pinning layer and is pinned to hard magnetization in a second direction by the second pinning layer, and
the soft portion layer is located between the hard portion layer and the spacer layer and such that the soft portion layer is only weakly pinned by the hard portion layer.

18. The magnetoresistive structure according to claim 16, further comprising a supporting data-read head structure that positions the magnetoresistive (MR) sensing element to sense a magnetic field in a data storage device.

19. A magnetoresistive element comprising:
a first soft ferromagnetic layer;
a hard ferromagnetic layer;
a first conductive non-ferromagnetic spacer layer located between the first soft ferromagnetic layer and the hard ferromagnetic layer and adjoining each;
a second soft ferromagnetic layer; and
a second conductive non-ferromagnetic spacer layer located between the second soft ferromagnetic layer and the hard ferromagnetic layer and adjoining each.

20. The magnetoresistive structure according to claim 19, wherein the first and second soft layers are each approximately one hundred angstroms permalloy (100 Å NiFe), the first and second conductive non-ferromagnetic spacer layers are each approximately thirty-five angstroms copper (35 Å Cu), and the hard ferromagnetic layer is approximately ten angstroms cobalt (100 Å Co).

* * * * *

UNITED STATES PATENT AND TRADEMARK OFFICE
CERTIFICATE OF CORRECTION

PATENT NO. : 6,166,539
DATED : December 26, 2000
INVENTOR(S) : E.D. Dahlberg and Timothy J. Moran It is certified that error appears in the above-identified patent and that said Letters Patent is hereby corrected as shown below:

<u>Tilte page,</u>
Item [54], title should read -- MAGNETORESISTIVE ELEMENT AND STRUCTURE --

<u>Column 2,</u>
Line 34, delete "prior art in FIG. 5A" and insert -- in prior art FIG. 5A --
Line 49, delete "U;S" and insert -- U.S. --

<u>Column 7,</u>
Line 18, delete "71" and insert -- 7I --

<u>Column 11,</u>
Line 40, delete "41" and insert -- 4I --

<u>Column 18,</u>
Line 12, delete "71" and insert -- 7I --

<u>Column 20,</u>
Line 66, delete "$(H_S(DC)-H)/H_{EX}$" and insert -- $(H_S(DC)-H_{TR})/H_{EX}$ --

<u>Column 21,</u>
Line 12, delete "$R(DC)=R_0+(\Delta R/2\pi)((1)((\pi/2+h\pi/2)-(-\pi/2-h\pi/2))+(-1)((3\pi/2-h\pi/2)-(\pi/2+\pi/2)))$" and insert --$R(DC)=R_0+(\Delta R/2\pi)((1)((\pi/2+h\pi/2)-(-\pi/2-h\pi/2))+(-1)((3\pi/2-h\pi/2)-(\pi/2+h\pi/2)))$--

Line 23, delete "$V_{OUT}^{(DC)}=I_S\Delta R(H_{AP} + H_{BIAS} - H_{TR})/H_{EX} + I R_0$" and insert --$V_{OUT(DC)}=I_S\Delta R(H_{AP} + H_{BIAS} - H_{TR})/H_{EX} + I R_0$--

Line 48, 5 equations are missing.

Insert --$R(\cos(2\omega t))=(\Delta R/4\pi)(\sin(\pi+h\pi)-\sin(-\pi-h\pi)-\sin(3\pi-h\pi)+\sin(\pi+h\pi))$--
Insert --$R(\cos(2\omega t))=(\Delta R/4\pi)(2\sin(\pi+h\pi) - 2\sin(-\pi-h\pi))$--
Insert --$R(\cos(2\omega t))=(\Delta R/\pi)\sin(\pi+h\pi)$--
Insert --$R(\cos(2\omega t))=(\Delta R/\pi)\sin(h\pi)$--   as long as h<1
Insert --$R(\cos(2\omega t)) \sim \Delta R\, h$   For h<<1 ← desired operation for maximum sensitivity and operation within linear region--

UNITED STATES PATENT AND TRADEMARK OFFICE
CERTIFICATE OF CORRECTION

PATENT NO. : 6,166,539
DATED : December 26, 2000
INVENTOR(S) : E.D. Dahlberg and Timothy J. Moran It is certified that error appears in the above-identified patent and that said Letters Patent is hereby corrected as shown below:

Column 22,
Lines 33 and 34, delete "(" before the symbol "Φ"

Column 23,
Line 12, delete "1A-1C" and insert -- 11A-11C --

Column 24,
Line 13, delete "1A-1C" and insert -- 11A-11C --
Line 36, delete "r(cos((ωt))−cos((π/2)(1+h))sin(kπ/2)+2cos((π/2)(3−h))sin (kπ/2)"
and insert --r(cos((ωt))−2cos((π/2)(1+h))sin(kπ/2)+2cos((π/2)(3−h)) sin(kπ/2)--

Signed and Sealed this

Twenty-seventh Day of May, 2003

JAMES E. ROGAN
*Director of the United States Patent and Trademark Office*